(12) United States Patent
Testa et al.

(10) Patent No.: US 12,336,140 B2
(45) Date of Patent: Jun. 17, 2025

(54) DIELECTRIC LIQUID IMMERSION COOLING CONTAINER

(71) Applicant: SLICIP, Inc., Tyler, TX (US)

(72) Inventors: Gary D. Testa, St. Petersburg, FL (US); Dmitry Fomin, Sarasota, FL (US)

(73) Assignee: SLICIP, Inc., Tyler, TX (US)

( * ) Notice: Subject to any disclaimer, the term of this patent is extended or adjusted under 35 U.S.C. 154(b) by 0 days.

(21) Appl. No.: 18/675,691

(22) Filed: May 28, 2024

(65) Prior Publication Data

US 2024/0314974 A1 Sep. 19, 2024

Related U.S. Application Data

(63) Continuation of application No. 18/505,016, filed on Nov. 8, 2023, now Pat. No. 11,997,826, which is a continuation-in-part of application No. 18/312,941, filed on May 5, 2023, now Pat. No. 11,943,897.

(60) Provisional application No. 63/399,475, filed on Aug. 19, 2022, provisional application No. 63/338,729, filed on May 5, 2022.

(51) Int. Cl.
  *H05K 7/20* (2006.01)
  *G06F 1/20* (2006.01)
  *H01L 23/44* (2006.01)

(52) U.S. Cl.
  CPC ..... *H05K 7/20272* (2013.01); *H05K 7/20236* (2013.01); *G06F 1/20* (2013.01); *H01L 23/44* (2013.01)

(58) Field of Classification Search
  CPC .. H05K 7/20272; H05K 7/20236; G06F 1/20; H01L 23/44
  USPC .......................................................... 165/80.4
  See application file for complete search history.

(56) References Cited

U.S. PATENT DOCUMENTS

| | | | | |
|---|---|---|---|---|
| 11,006,547 | B2 * | 5/2021 | Gao | G06F 1/20 |
| 2022/0151097 | A1 * | 5/2022 | McManis | H05K 7/20272 |
| 2022/0361381 | A1 * | 11/2022 | Sweeney | H05K 7/20781 |
| 2023/0032562 | A1 * | 2/2023 | Sweeney | H05K 7/20781 |

OTHER PUBLICATIONS

International Search Report and Written Opinion for International Application No. PCT/US2024/054891, dated Mar. 5, 2025.

* cited by examiner

*Primary Examiner* — Joel M Attey

(74) *Attorney, Agent, or Firm* — Stephen E. Kelly; Andriy Lytvyn; Hill Ward Henderson, P.A.

(57) ABSTRACT

An immersion-cooling container for single-phase liquid dielectric immersion cooling. The container has a tank and a liner, which mate together to form a sealed inflow channel and one or more sealed outflow channels. The liner and the support base comprise one or more vents to permit passage of dielectric liquid to envelop and cool equipment disposed inside the container. The liner sidewalls define one or more flow channels that promote passage of the liquid coolant from the container and into the outflow channels, thereby enabling continuous circulation of the dielectric liquid.

19 Claims, 40 Drawing Sheets

DIELECTRIC LIQUID IMMERSION COOLING CONTAINER

CROSS-REFERENCE TO RELATED APPLICATIONS

Pursuant to 35 U.S.C. § 119(e) and 120, this application is a continuation of U.S. patent application Ser. No. 18/505,016, filed on Nov. 8, 2023, which is a continuation-in-part of U.S. patent application Ser. No. 18/312,941, filed on May 5, 2023, which claims the benefit of U.S. Provisional Patent Application Ser. No. 63/399,475, filed on Aug. 19, 2022, and claims the benefit of U.S. Provisional Patent Application Ser. No. 63/338,729, filed on May 5, 2022, the entire contents of each of which are incorporated herein by this reference.

BACKGROUND

(1) Field of Endeavor

The present invention relates generally to the field of immersion cooling of objects through the use of full immersion of said objects in liquid dielectric coolants, and more particularly, to liquid dielectric immersion cooling containers.

(2) Description of Related Art

Liquid Immersion Cooling is often performed by immersing an object to be cooled in a container filled with a liquid dielectric coolant. Such objects may be electronic circuits, batteries, or other heat-generating electronic components. The dielectric liquid is circulated through the container and around the object to remove heat from the surface of electronic components in or on the target object. Past dielectric cooling containers suffer from certain inefficiencies, such as the conduction and radiation of heat through and from the walls of the container, the conduction of electrical charge through the metallic materials typically used in the construction of the container, difficulties in scaling the production of such containers due to the nature of the metallic materials used in the manufacture of the containers, and a proclivity for air entrainment within the dielectric liquid, which reduces the cooling efficiency of the dielectric liquid. The containers are often constructed in configurations that promote only a single method of flow of circulating dielectric liquid coolant without the ability to adapt or adjust the circulation to the cooling demands that are unique or unusual to the object being cooled. Thus, using a standard container having circulation characteristics tailored to cooling a particular object may not provide ideal efficiency when used to cool another object having a different set of cooling demands.

Past containers are generally constructed from metals, FRPs (Fiber Reinforced Plastics), or other materials that are relatively expensive, or that require certain configurations or construction techniques that can be challenging or labor-intensive and thus difficult to produce in volume and expensive to modify to meet the demands of a specific object.

The present container seeks to overcome these issues by providing a customizable, modular container using layers of non-metallic, metallic, and other materials, having integrated flow channels that reduce or eliminate air entrainment, flow inefficiencies, manufacturing inconsistencies, and other drawbacks of traditional immersion cooling containers.

SUMMARY OF THE PREFERRED EMBODIMENTS

In an embodiment, the invention pertains to an immersion-cooling apparatus. The immersion-cooling apparatus has a tank having a first interior volume. The tank has a bottom and one or more walls that at least partially enclose an interior volume. The tank may or may not have a fully or partially sealed lid or cover. The immersion-cooling apparatus further includes a liner disposed within the first interior volume of the tank. The liner has an exterior surface and a second interior volume configured to retain an electronic object therein—for example, a heat generating electronic device.

An inflow channel is defined within the first interior volume of the tank. An inlet is fluidly coupled to the tank, wherein the inlet is in fluid communication with the inflow channel. In this manner, a dielectric liquid from a source external to the tank is able to enter into the inflow channel via the inlet.

The liner has a vent aperture, which is in fluid communication with the inflow channel. Thus, the dielectric liquid is able to enter into the second interior volume of the liner via the vent aperture. As the dielectric liquid fills the second interior volume of the liner, the object positioned therein becomes immersed into the dielectric liquid, thereby enabling heat transfer between the object and the dielectric liquid.

A flow channel is defined within a space between the exterior surface of the liner and an interior surface of the tank, such that the dielectric liquid is configured to enter into the flow channel upon overflowing the second interior volume of the liner. The flow channel is in fluid communication with an outflow channel, which is defined within the first interior volume of the tank and is external to the liner. The tank has an outlet fluidly coupled thereto. The outlet is in fluid communication with the outflow channel, thereby enabling the dielectric liquid to exit the first interior volume of the tank via the outlet.

In an embodiment, the tank has a first corrugation that opens to the first interior volume of the tank. In this embodiment, a flow channel is defined within the corrugation. The tank may include a second corrugation, such that the first and the second corrugations define a receiving channel there-between. This receiving channel is configured to receive a corrugation of another tank, thereby enabling a plurality of tanks to be arranged in a mated relationship with one another, forming an array. One or more flow regulators may be disposed within the flow channels. The flow regulators are configured therein to prevent air bubbles from forming and/or becoming entrapped within the dielectric liquid as it flows through or down the flow channel.

In an embodiment, the immersion-cooling apparatus further includes a support base disposed within the second interior volume of the liner. The support base is configured to support the object thereon. The support base has one or more openings disposed therein configured to enable the dielectric liquid to flow therethrough. The support base may be placed on a shoulder or spacer within the liner, such that the support base is maintained at a predefined distance relative to the vent aperture of the liner. The vent aperture of the liner and the one or more openings of the support base may be elongated, circular, or of a shape or dimension configured for improved heat transfer by promoting a flow of dielectric fluid through and around the particular electronic object immersed in the tank. In an embodiment, the longitudinal axes of the vent aperture within the liner and the openings within the support base are not directionally aligned with one another.

In an embodiment, an interior surface of the bottom of the tank, the exterior surface of the liner, or both may include one or more dividers. The divider may be configured to partition the first interior volume of the tank into the inflow channel and the outflow channel when the liner is seated within the first interior volume of the tank. The exterior surface of the liner is configured to be disposed in an abutting contact with the walls and/or the bottom of the tank, forming a liquid-impermeable seal at their interface.

The inlet and outlet may be disposed in various arrangements. In some embodiments, the inlet and/or the outlet may be fluidly coupled to the bottom of the tank. In other embodiments, the inlet and/or the outlet may be fluidly coupled to the one or more walls of the tank.

The inflow and outflow channels may have various configurations. The inflow channel, the outflow channel, or both may defined between the bottom of the tank and the exterior surface of the liner. In some embodiments, the inflow channel may be defined within the interior of the liner.

In an embodiment, a ledge is disposed on an interior surface of the one or more walls of the tank. In this embodiment, the ledge, the interior surface of the one or more walls of the tank, and the exterior surface of the liner collectively define the flow channel, the outflow channel, or both. The ledge may have a downward slope directing the dielectric liquid to flow toward the outlet.

In an embodiment, the immersion-cooling apparatus includes a directional nozzle positioned within the second interior volume of the liner. The directional nozzle is in fluid communication with the inflow channel and is configured to direct the dielectric liquid flow toward a target area on the object.

The immersion-cooling apparatus, may include a second liner positioned within the second interior volume of the first liner. The first liner and the second liner form a fluid-impermeable seal at their interface. In this embodiment, the inflow channel may be defined within the space between the first and the second liners. The second liner may have an aperture in fluid communication with the inflow channel, and a directional nozzle may be configured to fluidly couple to the aperture.

DESCRIPTION OF THE PREFERRED EMBODIMENT

Figure 1:
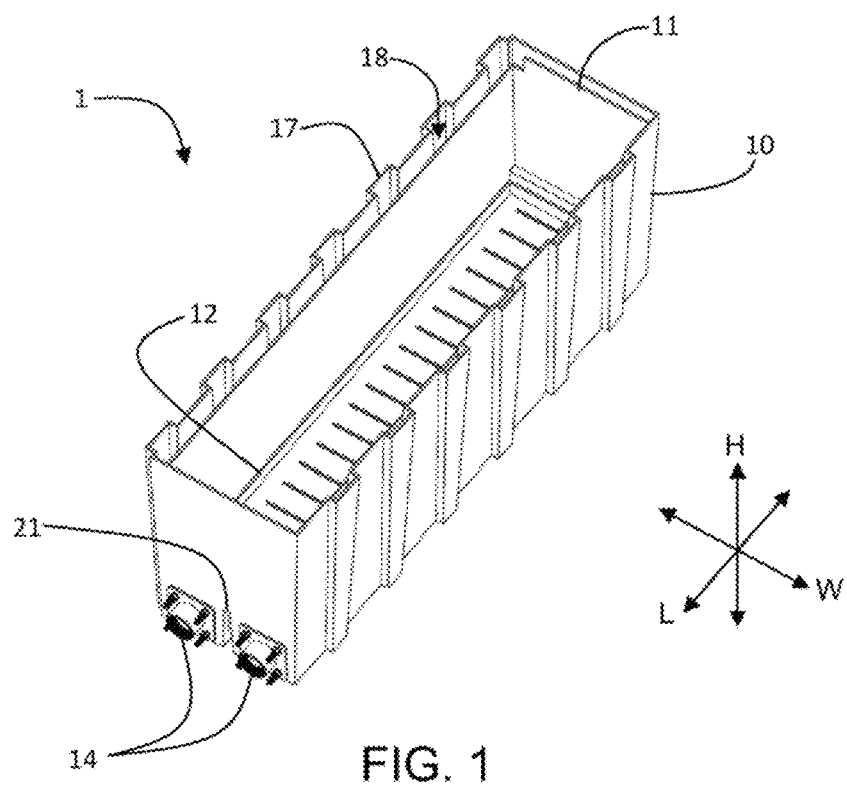
FIG. 1 is a trimetric view of an embodiment of the submersion container.

With reference to the drawings, the liquid dielectric cooling immersion container will now be described with regard for the best mode and the preferred embodiment. In general, the device is a customizable, modular immersion container for liquid dielectric cooling. The embodiments disclosed herein are meant for illustration and not limitation of the invention. An ordinary practitioner will appreciate that it is possible to create many variations of the following embodiments without undue experimentation by varying such factors as width, length, height, inserts, etc. Unless otherwise specified herein, references to length refer to dimensions in the L direction shown in FIG. 1, references to width refer to dimensions in the W direction, and references to height refer to dimensions in the H direction.

The liquid dielectric immersion container is described herein in terms of cooling an electronic object 42. However, an ordinary practitioner will appreciate that the immersion container 1 and the dielectric liquid can be used for thermal management of the electronic object. In this context, the term thermal management and related terms means maintaining, controlling, regulating, insulating, or adjusting the temperature of the subject electronic object 42. The term dielectric liquid means a dielectric heat transfer fluid used for thermal management of an electronic object 42. The electronic object 42 may be a computer server or rack of servers, a battery or bank of batteries, or one or more electronic processors, transformers, capacitors, electric motors, or a variety of other high- and low-voltage electronic components or objects. Thermal management may include cooling of the electronic object 42, for example, the cooling of computer servers engaged in general compute, cloud services, etc. Another form of thermal management may include heating of the electronic object 42, for example, the heating of batteries that are operating in very cold (e.g., sub-zero) conditions. Another form of thermal management may include simply maintaining the temperature of the electronic object 42 at a preferred temperature, for example, the maintenance of a laser to its preferred operating temperature to eliminate temperature-related frequency variation. An ordinary practitioner will appreciate a wide range of other circumstances and scenarios where thermal management of an electronic object 42 will promote efficient or desirable operation of the electronic object 42, and may even be required to enable any operation at all of the electronic object 42.

The container 1 components may be formed by attaching multiple plastic corrugated panels with designed channels for liquid handling (channeling), as described in more detail below. The embodiments described below can be constructed in one piece by using 3D printing technology, or by using a variety of metals, plastics, fiberglass, carbon fiber composites, or the like. In any of the embodiments, one or more of the components discussed herein comprise acrylonitrile butadiene styrene and corresponding thermoforming methods. Some examples of the cooling liquid that could be used with the container 1 include water, de-ionized water, mineral oils, two-phase dielectric liquids, single-phase dielectric liquids, or a combination thereof.

Figure 2:
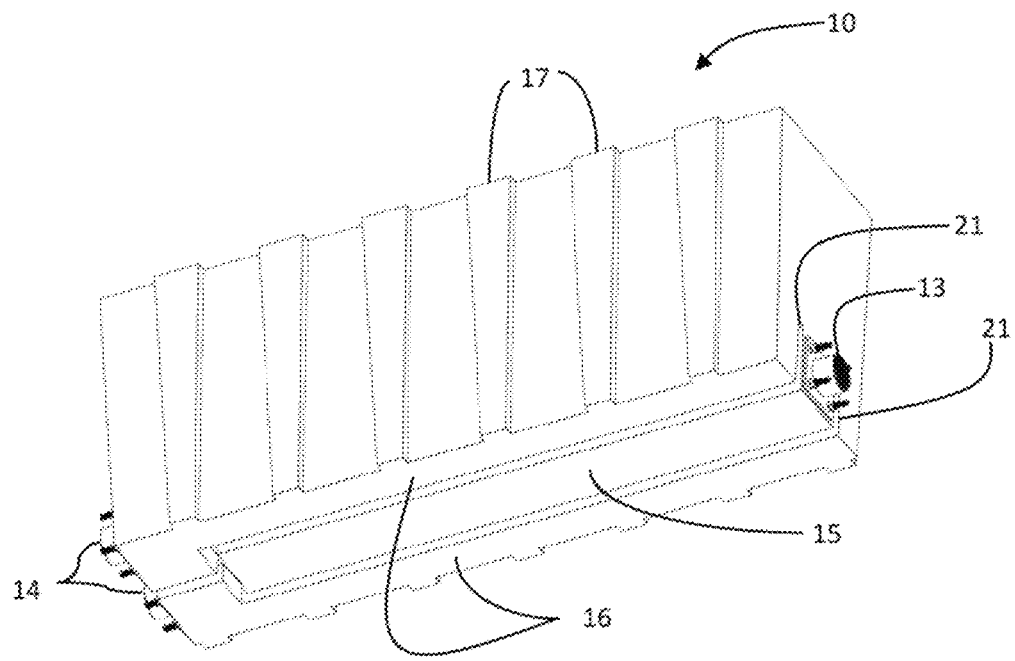
FIG. 2 depicts the bottom and side of an embodiment of the submersion container.
Figure 3:
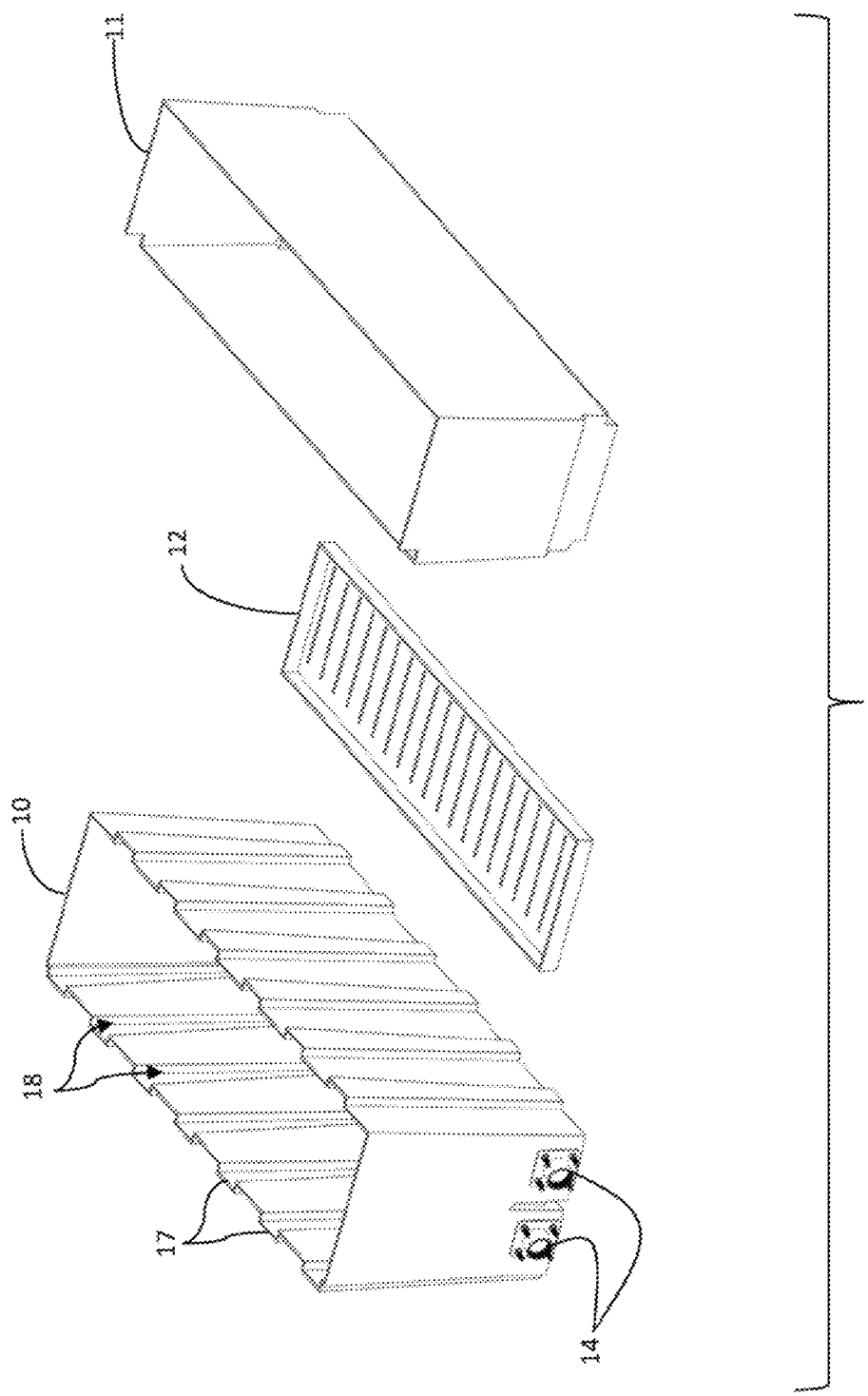
FIG. 3 depicts an embodiment of the disassembled tank, liner, and support base.

Referring to FIGS. 1-3, one embodiment of the container 1 comprises a tank 10 having a first interior volume, a liner 11 having a second interior volume, and a support base 12. The tank 10, liner 11, and support base 12 mate together to define at least one inflow channel 15 and at least one outflow channel 16. The tank 10 comprises one or more corrugations 17, such as a channels, grooves, furrows, or other contoured features, each defining a flow channel 18 between the liner 11 and the tank 10. In an embodiment, the corrugations 17 are tapered, being narrower at the bottom and wider at the top. This enables stacking of the tanks 10 of the containers 1 in arrays, as discussed in more detail below. The corrugations 17 may be linear or non-linear, regular or irregular, disposed vertically, diagonally, or in any other configuration that is suitable for the purposes discussed below.

Figure 4:
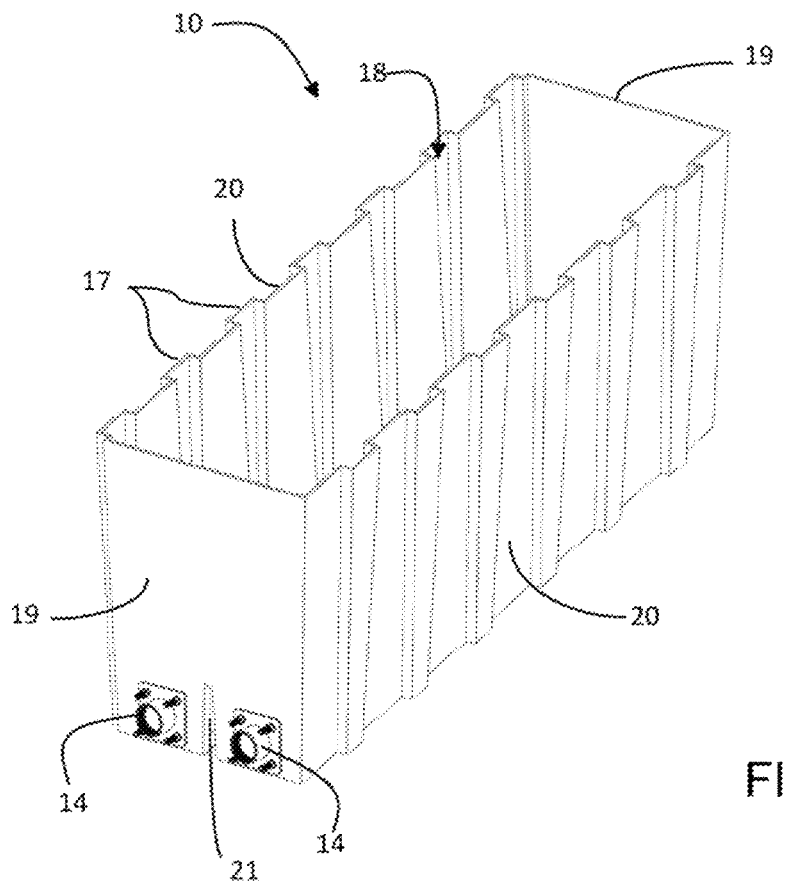
FIG. 4 is a trimetric view of one embodiment of the tank.
Figure 5:
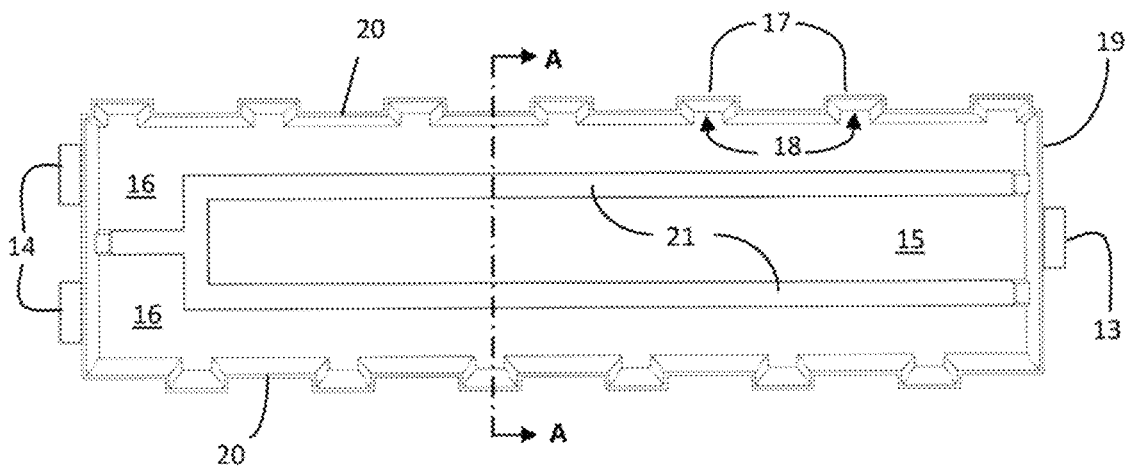
FIG. 5 is a top view of one embodiment of the tank.
Figure 6:
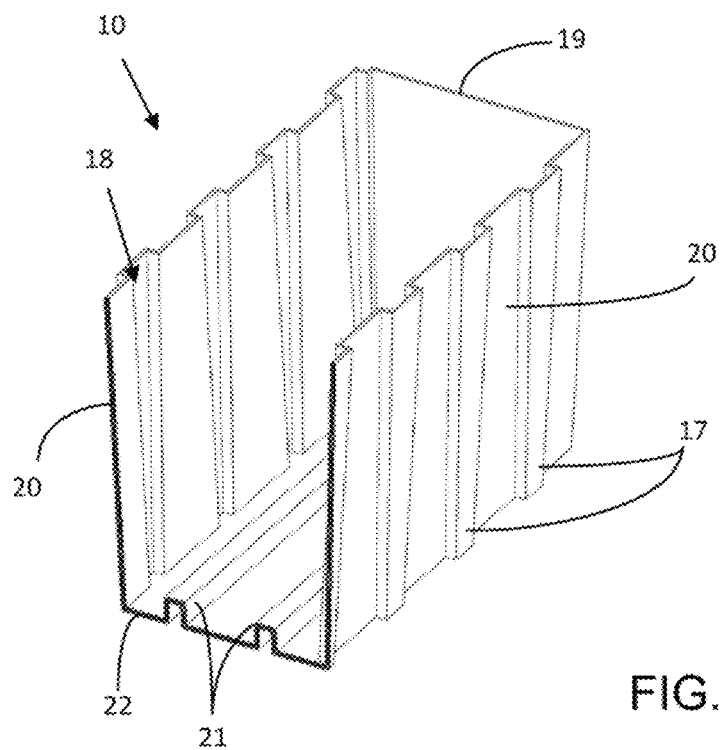
FIG. 6 is a trimetric view of cross-section A-A from FIG. 5.

Referring to FIGS. 4-6, one embodiment of the tank 10 generally defines the box-like shape of the container 1 embodiment introduced above. In this embodiment, the tank 10 comprises two end walls 19 and two sidewalls 20. One or more dividers 21 are located inside the tank 10 in communication with a tank bottom 22 of the tank 10. The dividers 21 are disposed to mate with the liner 11 to define the inflow channel(s) 15 and outflow channel(s) 16, as described in more detail below.

Figure 7:
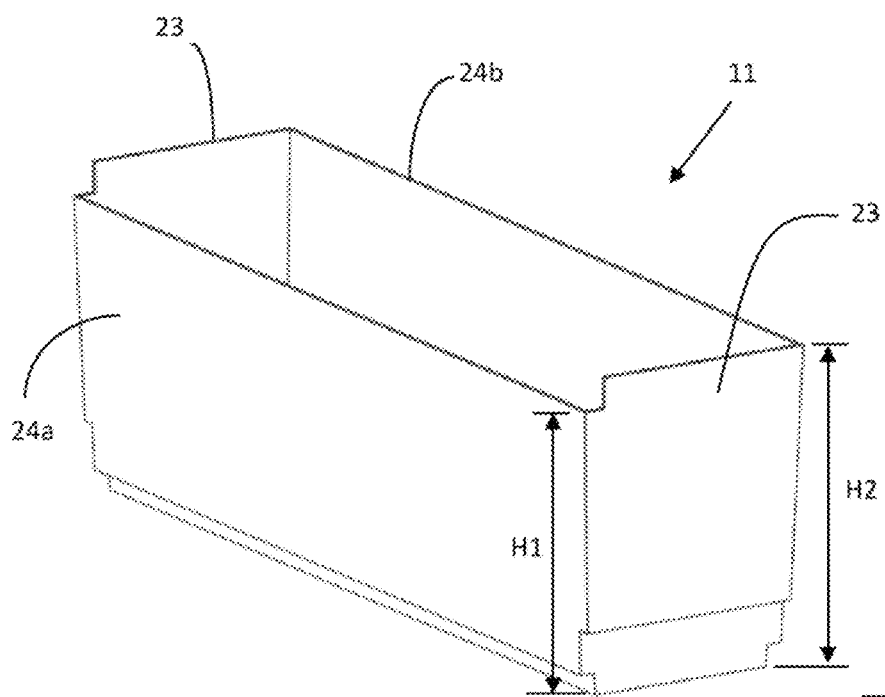
FIG. 7 depicts an embodiment of a liner.
Figure 8:
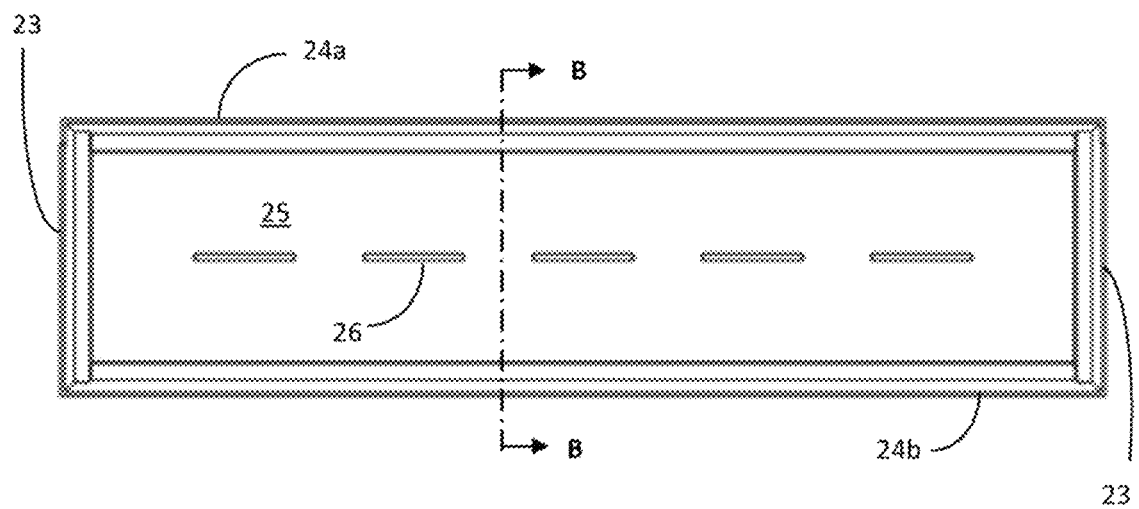
FIG. 8 is a top view of one embodiment of a liner.
Figure 9:
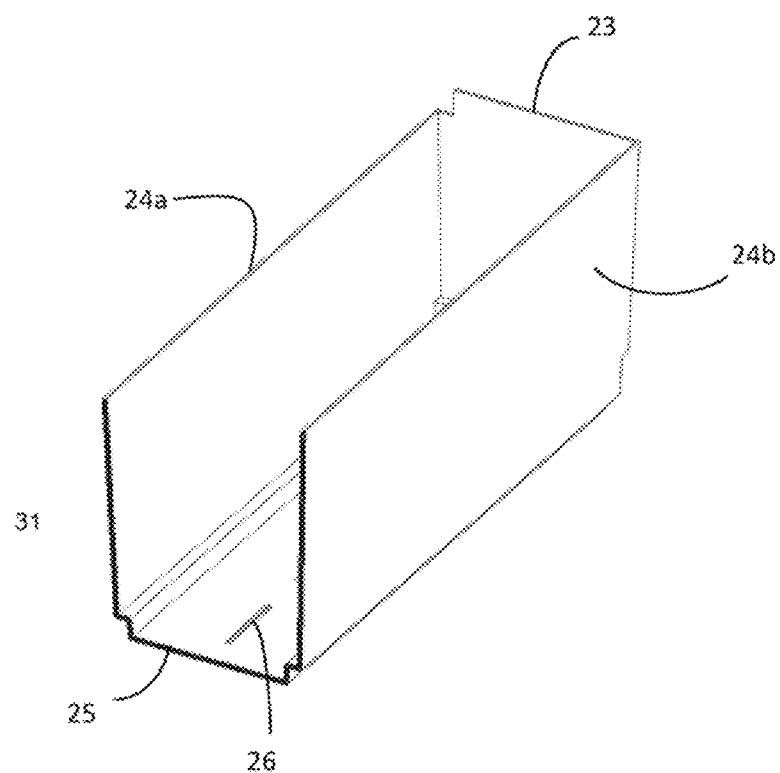
FIG. 9 depicts a trimetric view of cross-section B-B from FIG. 8.

Referring to FIGS. 7-9, an embodiment of the liner 11 has a rectangular, or box-like, shape for mating insertion inside the tank 10. The liner 11 has liner end walls 23, liner sidewalls 24a and 24b, and a liner bottom 25 having one or more liner vents 26. The liner vents 26 permit passage of the dielectric cooling liquid to pass from the inflow channel(s) 15 to the interior of the container 1. The liner vents 26 comprise one or more ports, apertures, slots, openings, or the like. The liner further comprises a shoulder 31 configured to support the support base 12 thereon in an elevated position relative to the liner bottom 25. In this manner, the liner bottom 25 and the support base 12 define a chamber 32 therebetween, which becomes filled with the dielectric liquid as the liquid rises through the liner vents 26. In one embodiment, a first liner sidewall 24a has a height H1 and a second liner sidewall 24b has a height, H2, where H1 is less than H2.

Figure 10:
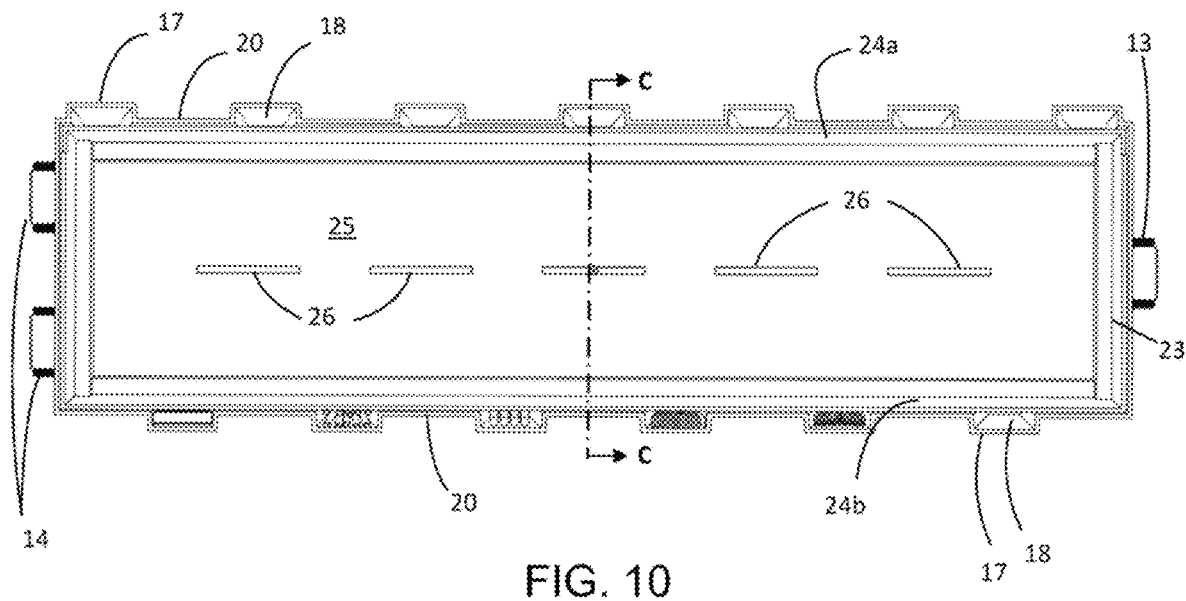
FIG. 10 is a top view of one embodiment of a liner disposed inside a tank.
Figure 11:
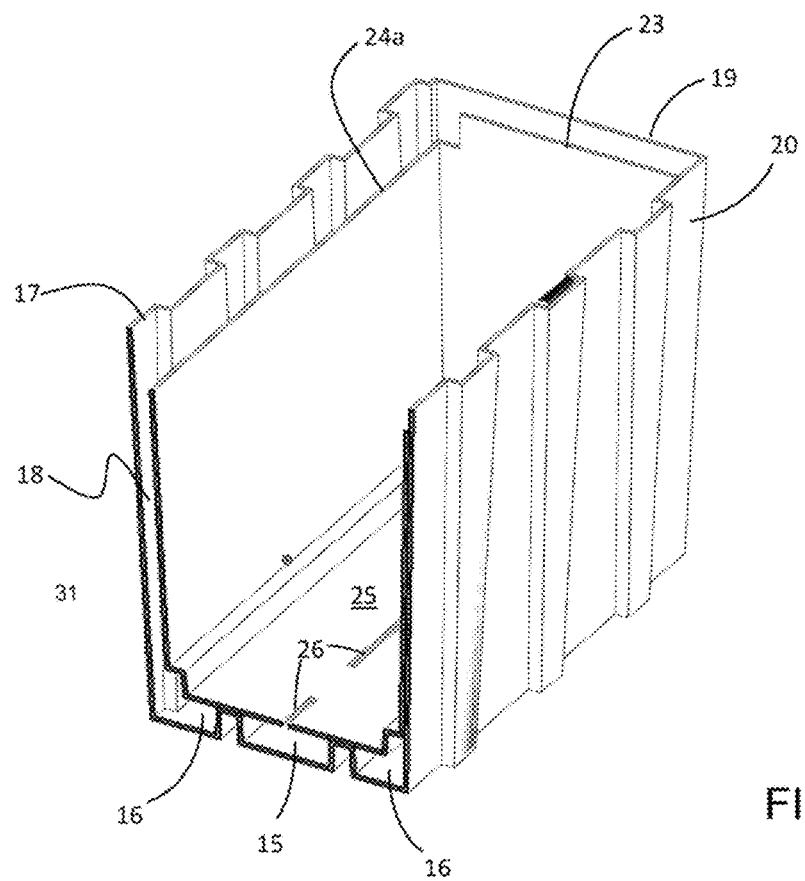
FIG. 11 depicts a trimetric view of cross-section C-C from FIG. 10.
Figure 12:
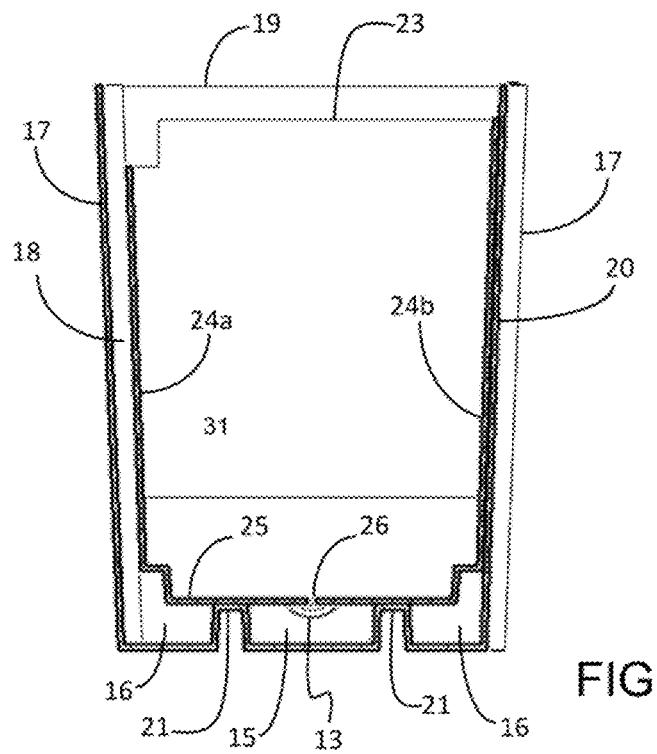
FIG. 12 is cross-section C-C from FIG. 10.

Referring to FIGS. 10-12, in one embodiment, the liner 11 mates with the tank 10 to define the inflow channel(s) 15 and the outflow channel(s) 16. The liner bottom 25 is seated against the top of the one or more dividers 21 forming a liquid-impermeable seal at their interface, thereby defining the inflow channel(s) 15 and outflow channel(s) 16. Further, the liner sidewalls 24a and 24b mate with the sidewalls 20 of 10 tank, forming a liquid-impermeable seal therebetween. In this manner, the corrugations 17 in the tank sidewall 20 define the flow channel(s) 18, formed between the exterior surfaces of the sidewalls 24a and 24b of the liner 11 and the interior surfaces of corrugations 17 of the tank 10.

Figure 13:
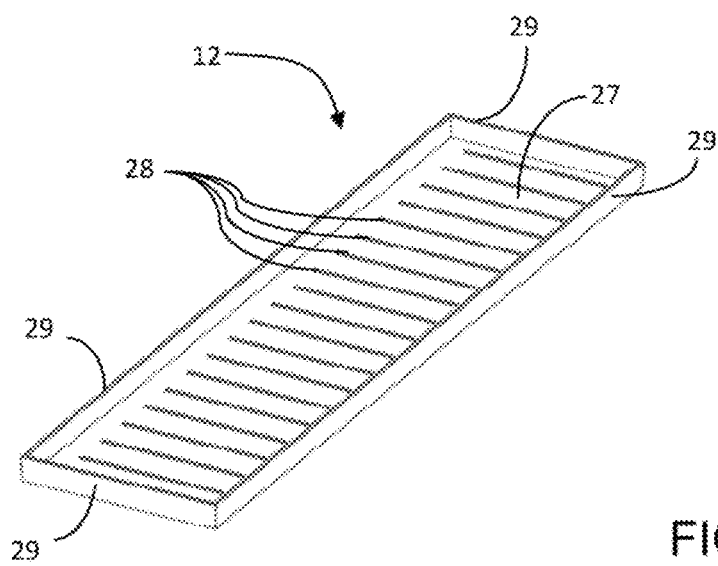
FIG. 13 depicts one embodiment of a support base.
Figure 14:
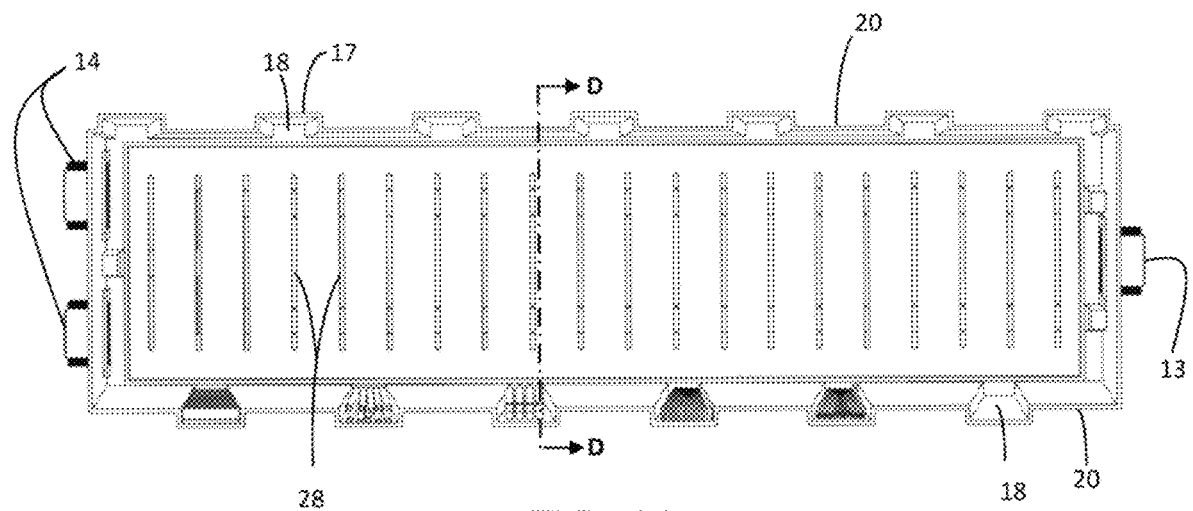
FIG. 14 is a top view of one embodiment of a support base disposed inside a tank without a liner in place.
Figure 15:
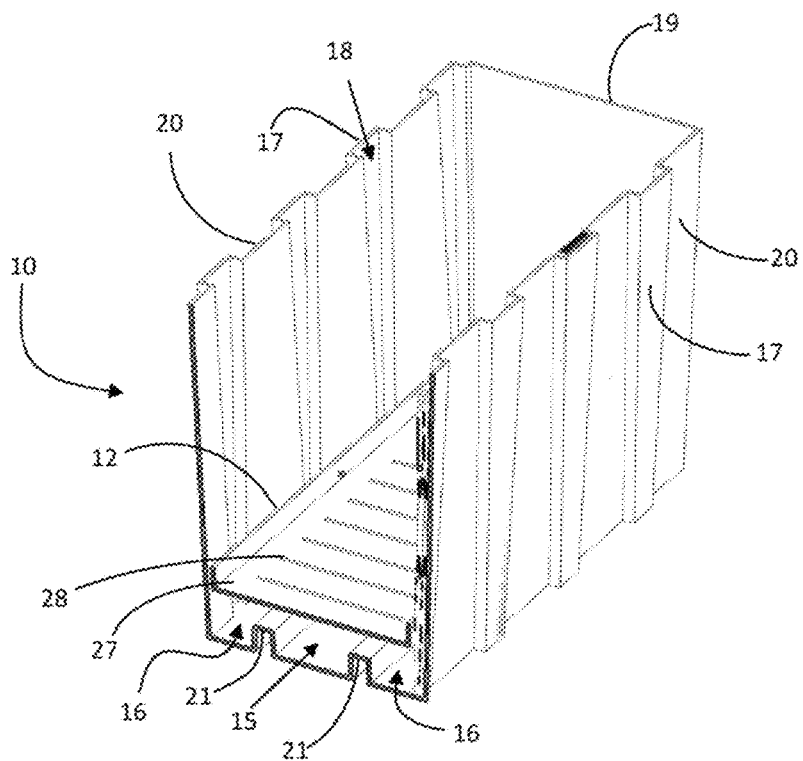
FIG. 15 depicts a trimetric view of cross-section D-D from FIG. 14.

Referring to FIGS. 13-15, one embodiment of the support base 12 comprises a bottom panel 27 having one or more vents 28 for promoting flow of the dielectric liquid inside the container 1. The vent 28 may be an elongated opening, such as a slot, that permits ingress of dielectric liquid in a wall-like, or curtain-like, plume. In this embodiment, each vent 28 preferably has an aspect ratio of 2:1 or greater. The elongate circulation vents 28 could have any shape meeting or exceeding this aspect ratio, whether a rectangle, oval, elongated hexagon or octagon, an arc, serpentine, or other curved shape, or the like.

Alternatively, each vent 28 could be a plurality of point vents disposed in an orientation where the combined effect of the point vents approximates the wall-like plume emitted from a single elongate vent 28. Each point vent can take a variety of shapes and forms, each having an aspect ratio of less than 2:1. The point vents could have a cross-sectional shape that is circular, triangular, square, or other regular polygonal shape, a star, a cross, or any other suitable shape.

The support base 12 may further comprise one or more stiffeners 29, such as edge walls, stems, webs, or the like. The stiffeners 29 provide structural support to the support base bottom panel 27 to carry the load of the equipment being cooled in the container 1.

Figure 16:
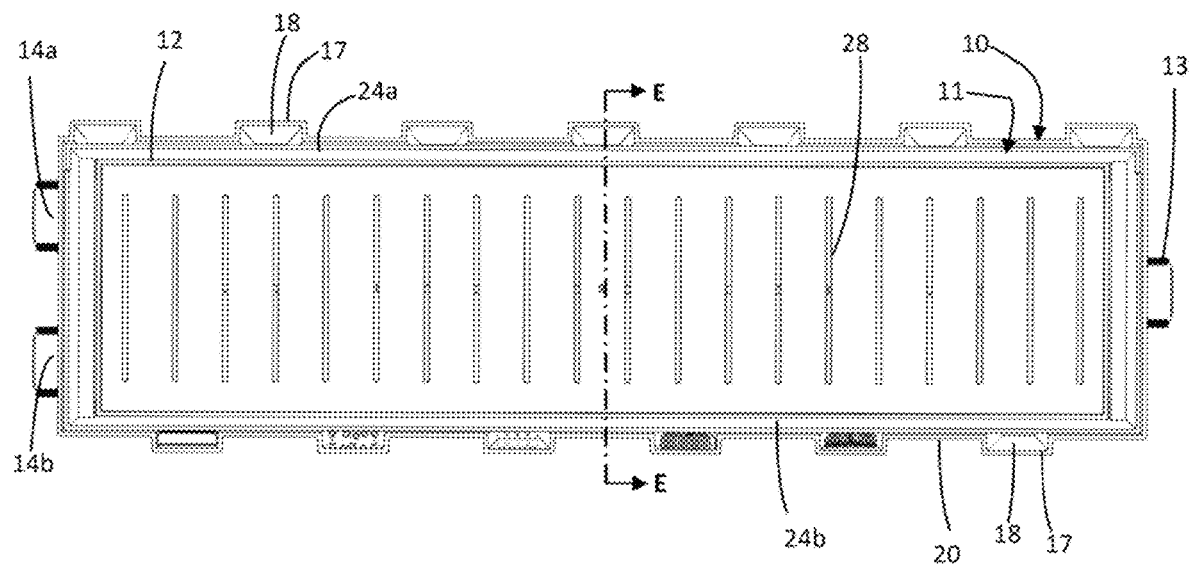
FIG. 16 is a top view of one embodiment of the container.
Figure 17:
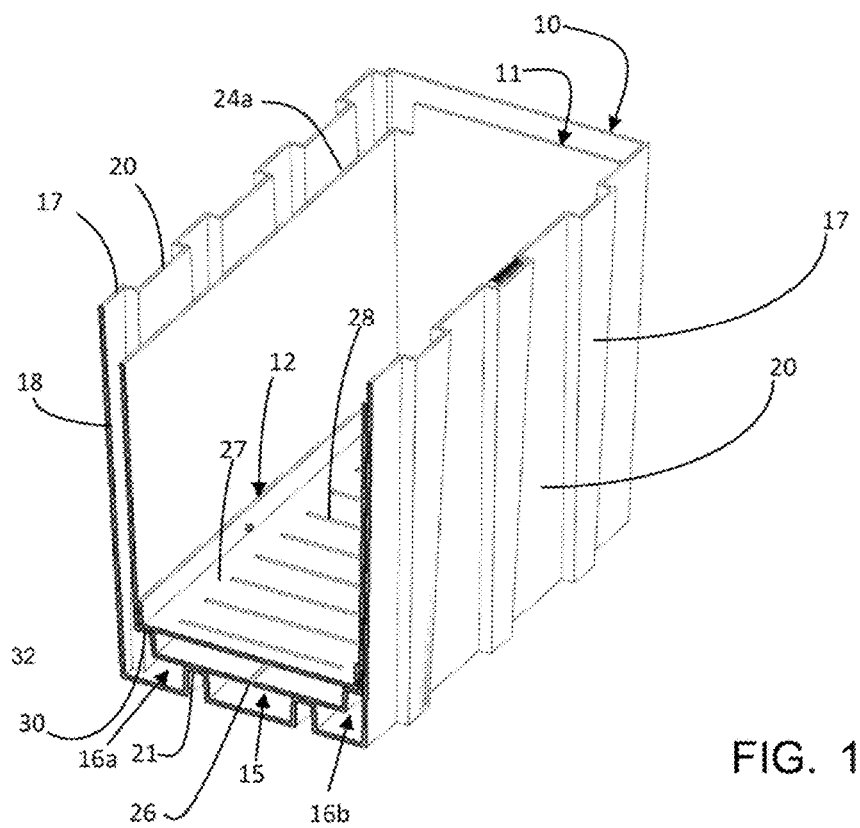
FIG. 17 depicts a trimetric view of cross-section E-E from FIG. 16.
Figure 18:
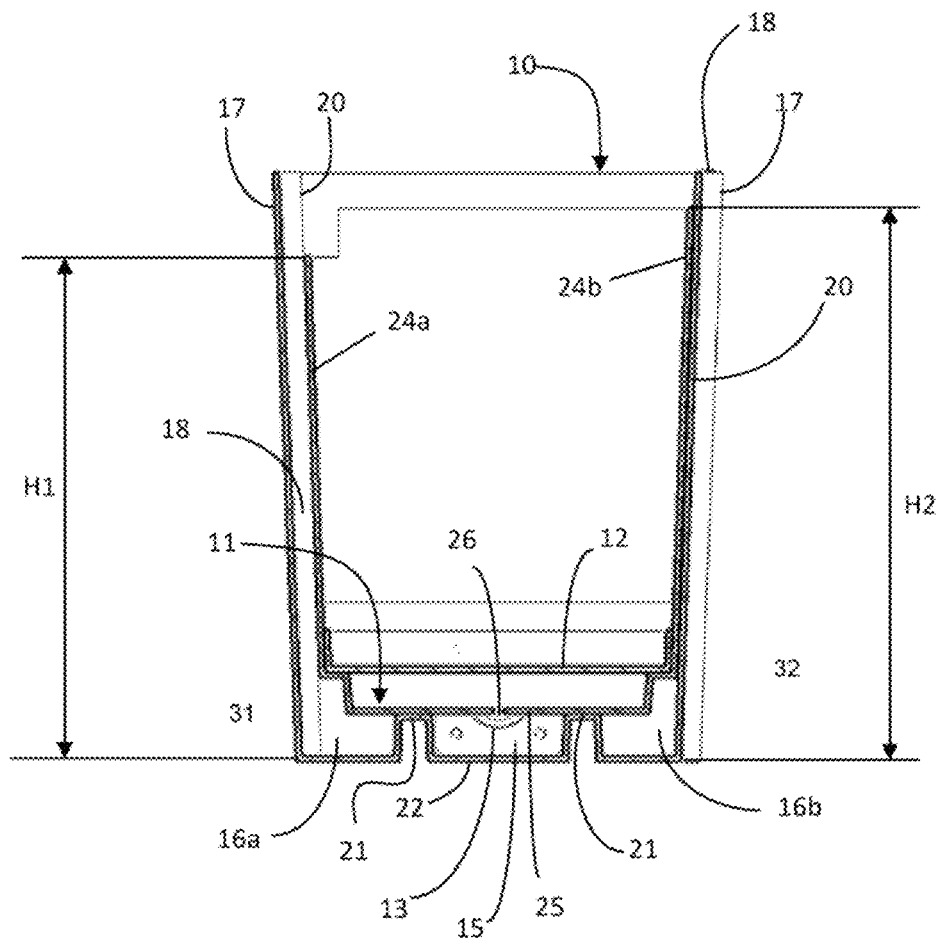
FIG. 18 is cross-section E-E from FIG. 16.
Figure 19A:
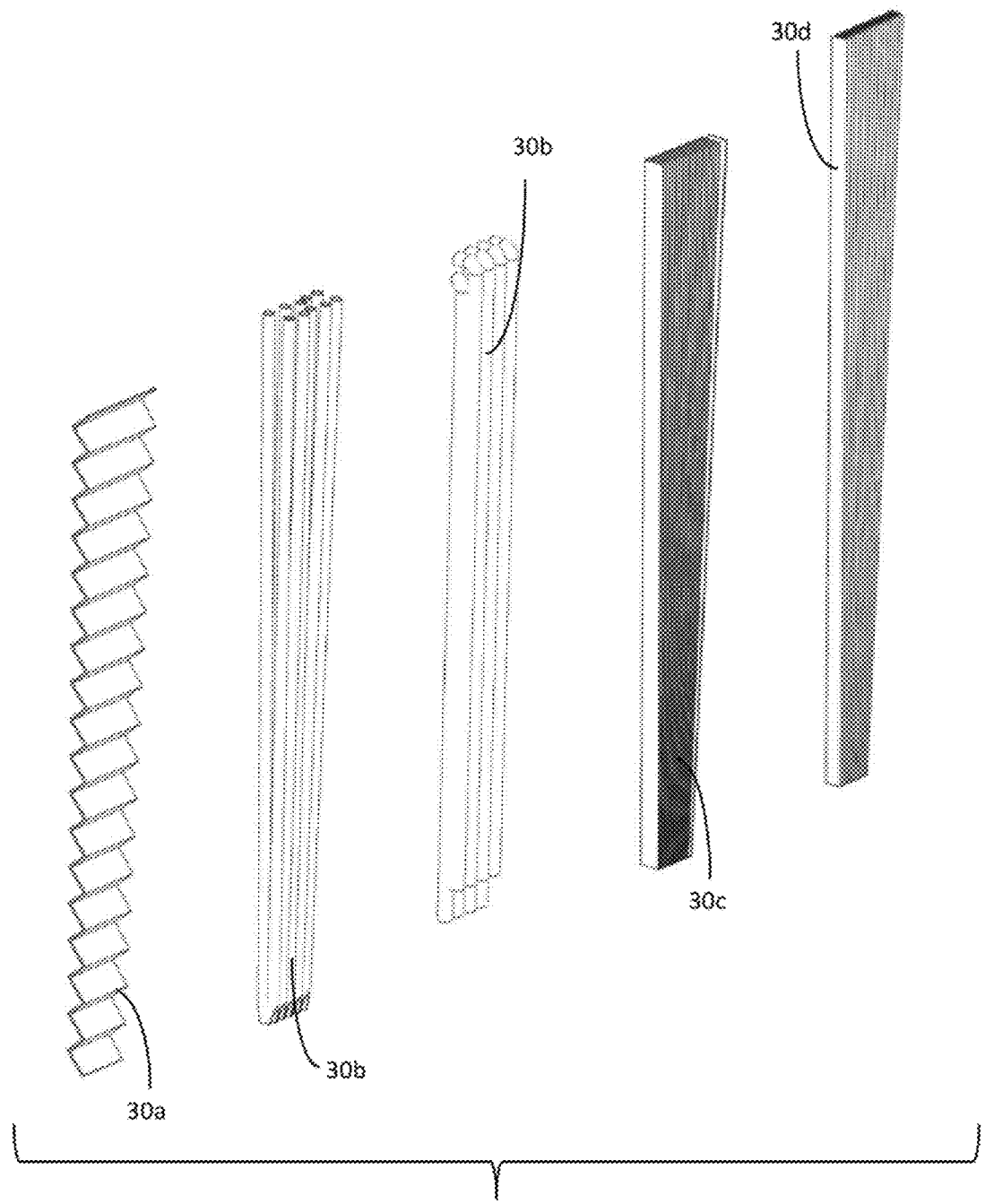
FIG. 19A depicts five embodiments of flow regulators.
Figure 19B:
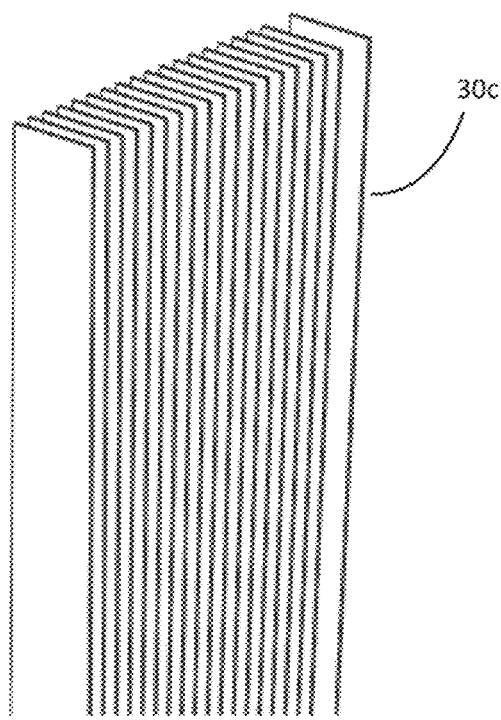
FIG. 19B is an enlarged view of an embodiment of a flow regulator that utilizes slats.
Figure 19C:
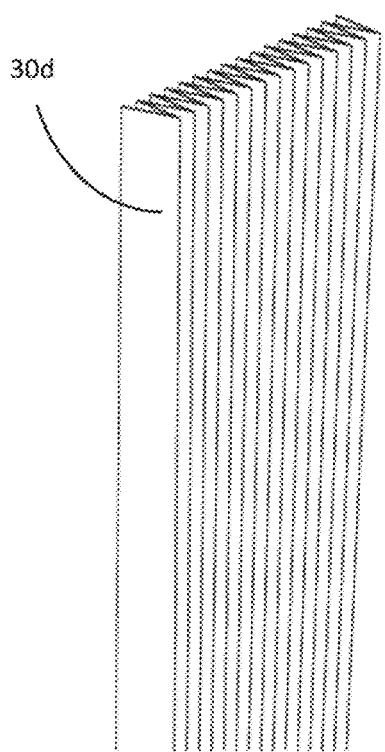
FIG. 19C is an enlarged view of an embodiment of a flow regulator that utilizes folds.
Figure 20A:
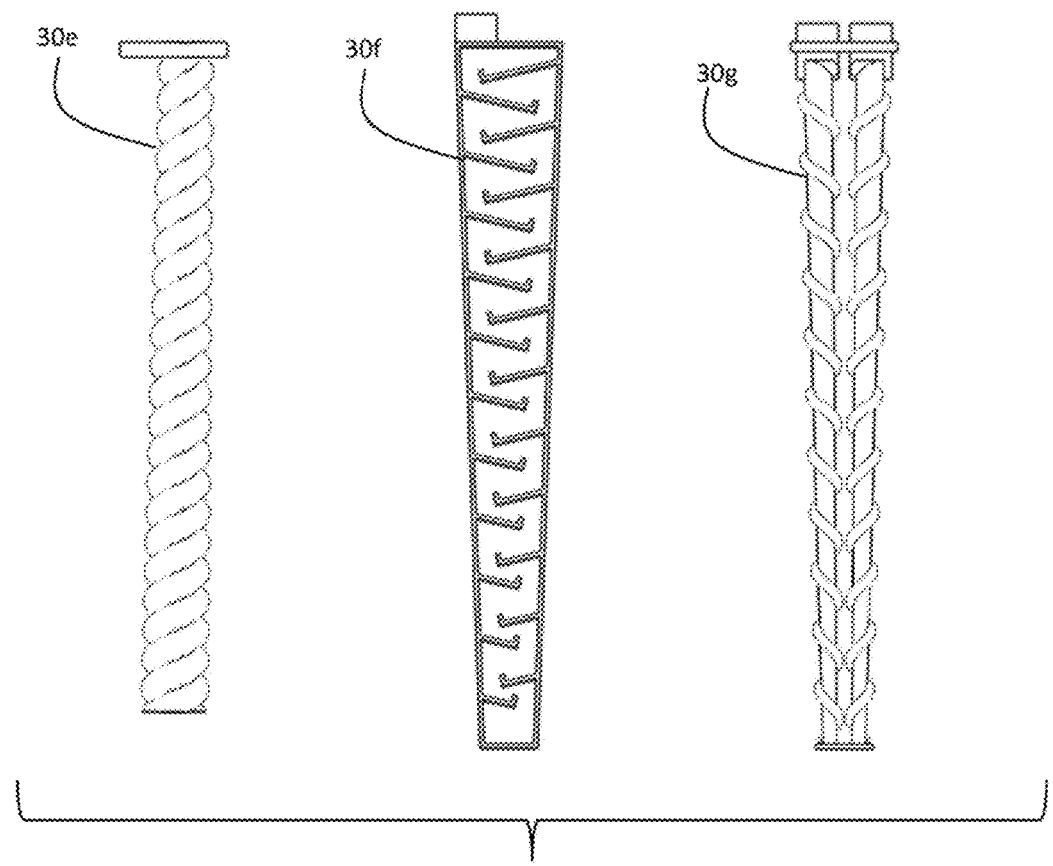
FIG. 20A is a front view depicting additional three embodiments of flow regulators.
Figure 20B:
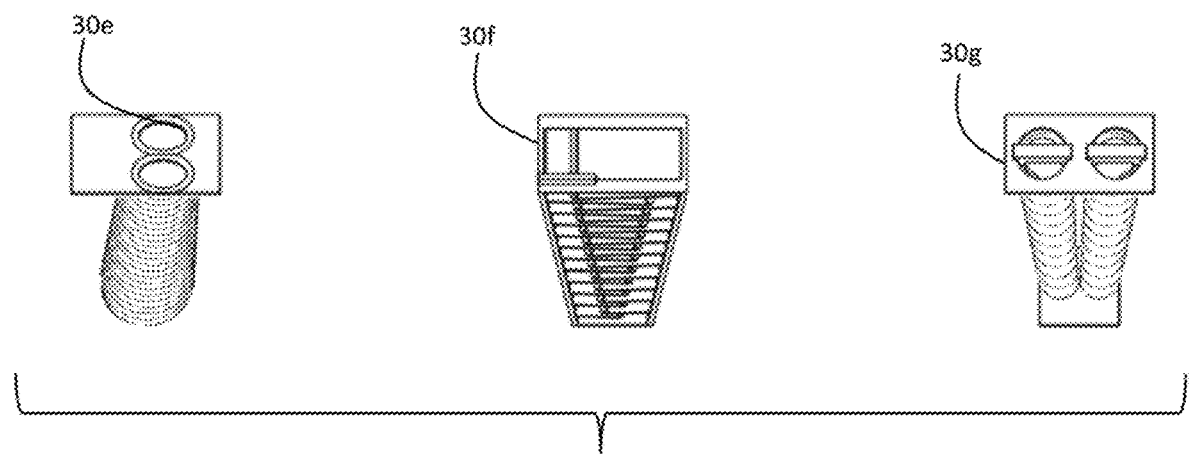
FIG. 20B is a perspective view depicting the three embodiments of flow regulators shown in FIG. 20A.

Referring to FIGS. 16-18, in one embodiment of the container 1, pressurized dielectric cooling liquid enters the container 1 via the inlet 13. The liquid then flows through the inflow channel 15 and rises into the second interior volume of the liner 11 via the liner vents 26. The dielectric liquid fills chamber 32, which is defined between the liner bottom 25 and the support base 12. The dielectric liquid then continues to rise through the vents 28 of the liner 12, whereby the equipment positioned on the support base 12 becomes immersed into the dielectric liquid. When the dielectric liquid level reaches the top of the first sidewall 24a of the liner 11 (height H1), the liquid flows over the first sidewall 24a and enters the flow channels 18. Gravity causes the dielectric liquid to flow through the channels 18, which direct the liquid into a first outflow channel 16a. The dielectric liquid then flows through the first outflow channel 16a and exits the tank 10 via the first outlet 14a. Continuous circulation of the dielectric liquid along this flow path facilitates heat transfer between the dielectric liquid and the equipment positioned on the support base 12, thereby effectively cooling the immersed equipment.

In the event that the first outflow channel 16a becomes blocked, the level of the dielectric liquid will continue to rise above the H1 level. When the liquid level exceeds the height of the second sidewall 24b of the liner 11 (height H2), the dielectric liquid flows or cascades over the second sidewall 24b of the liner 11 and into the flow channels 18 defined by corrugations 17 on the side of the tank 10 abutting the second sidewall 24b. The liquid passes through the flows channels 18 into a second outflow channel 16b, where the liquid exits the container 1 via the second outlet 14b. Thus, the differences in wall height H1 and H2 provide a fail-over safety feature in the event of blockage of the first outflow channel 16a.

Figure 21:
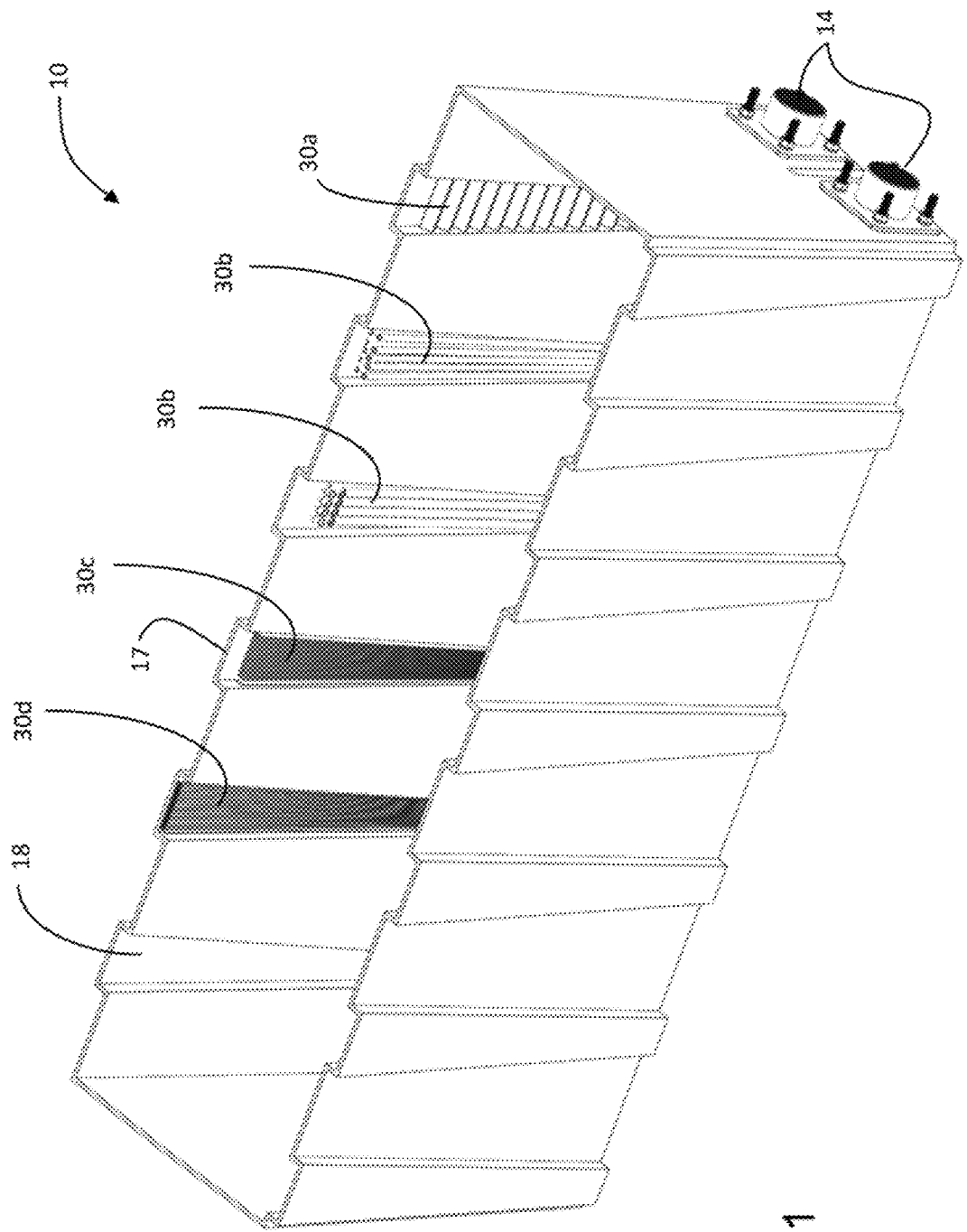
FIG. 21 depicts an embodiment of a container with flow regulators depicted in FIG. 19A disposed within a plurality of flow channels.
Figure 22:
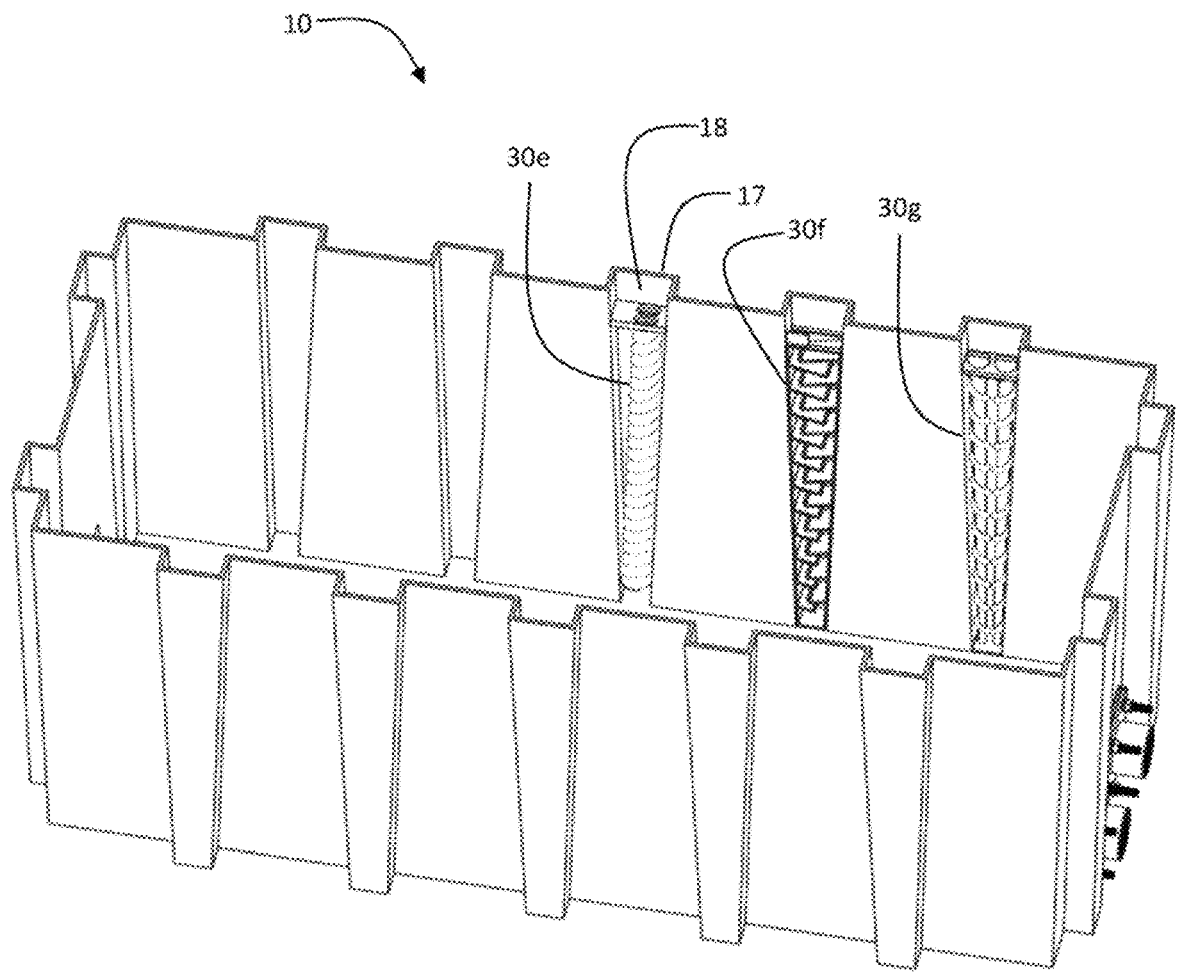
FIG. 22 is an embodiment of a container with flow regulators depicted in FIG. 20A disposed within a plurality of flow channels.
Figure 23:
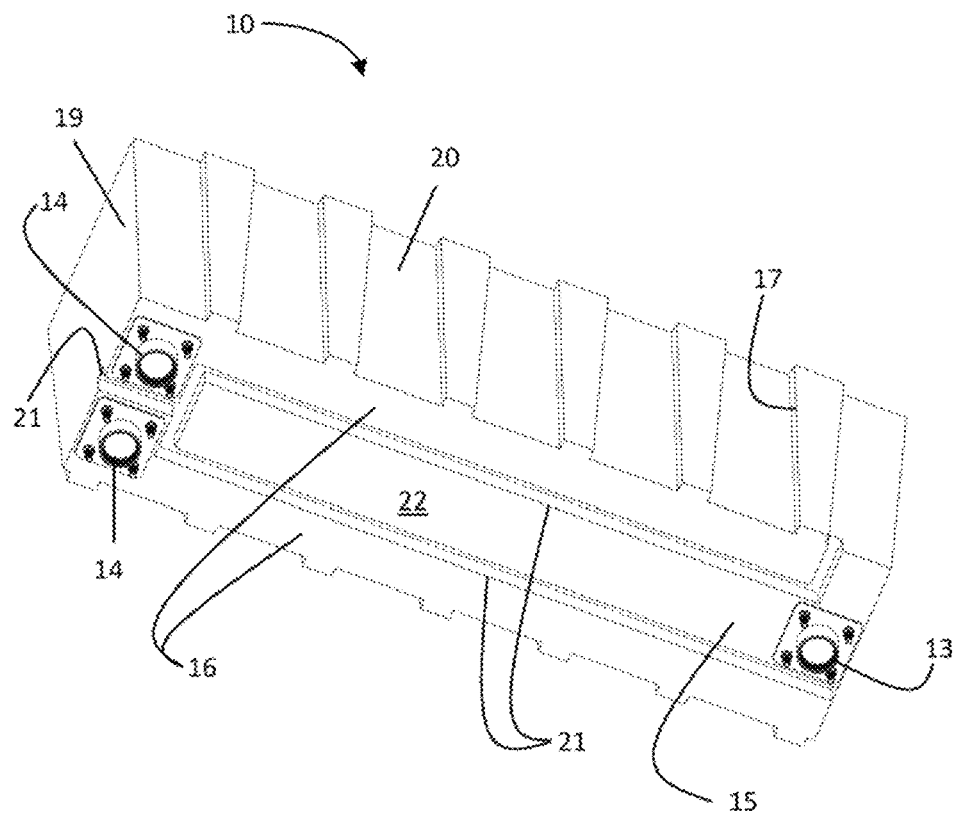
FIG. 23 is a perspective bottom view of an embodiment of a container having a dielectric liquid inlet and outlets positioned on the bottom of the container.

Referring to FIGS. 19-22, an embodiment of the container 1 may comprise one or more flow regulators 30. The flow regulators 30 enable the dielectric liquid to flow through the flow channel(s) 18 without entraining air bubbles in the dielectric liquid. Air entrainment is disadvantageous to liquid dielectric cooling because it materially reduces the efficiency of heat transfer facilitated by the liquid. The flow regulators 30 may be corrugations 30a, pipes 30b, slats 30c, folds 30d, spiral tubes 30e, cascades 30f, finned conduits 30g, baffles, rods, stringers, or other similar members that promote flow of the dielectric liquid coolant in a manner that reduces or eliminates air entrainment in the dielectric liquid. The regulators 30 can be used alone or in combination with other embodiments of regulators 30, and they can be used in one or more flow channels 18. FIGS. 21 and 22 show embodiments of the regulators 30 disposed in certain flow channels 18. The regulators 30 may be disposed in all or only some of the flow channels 18, and the regulators 30 disposed within the tank 10 may be all of the same type or different types.

Referring to FIGS. 23-27, in some embodiments, the inlets 13 and outlets 14 are disposed in the tank bottom 22. This configuration enables end walls 19 of adjacent tanks 10 to abut one another, without requiring a clearance therebetween to accommodate the inlet(s) 13 and outlet(s) 14 (as shown in FIG. 30). Furthermore, by disposing the inlet(s) 13 and outlet(s) 14 on the tank bottom 22, the container 1 can be efficiently positioned on a rack 35, as depicted in FIGS. 28 and 29.

Figure 28:
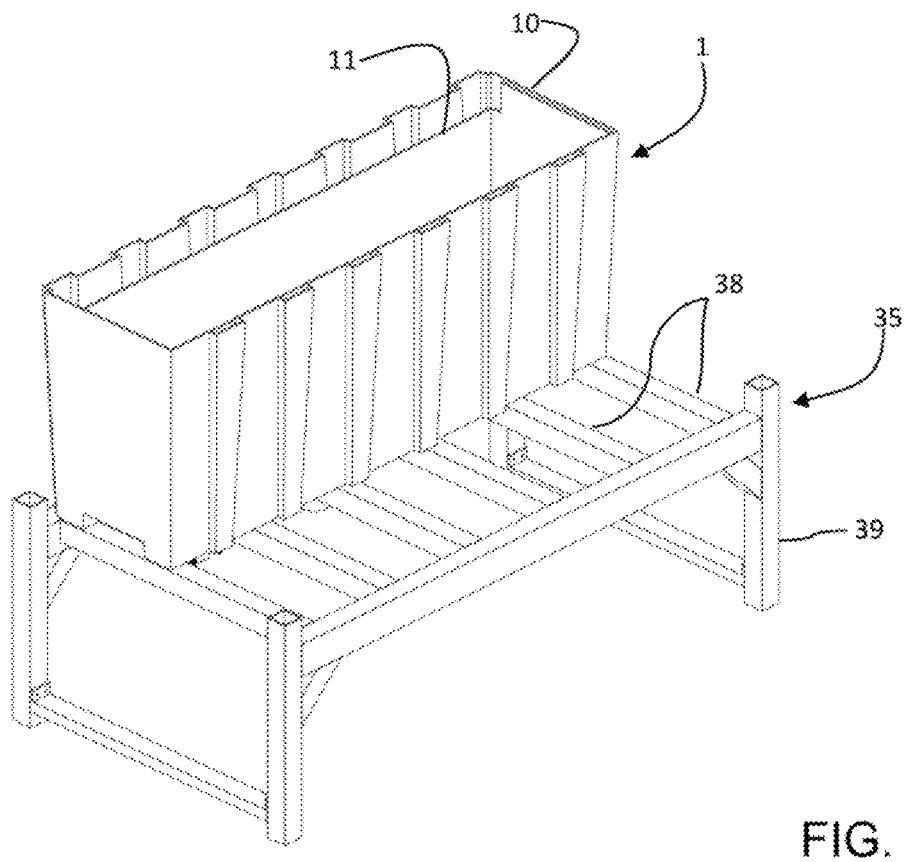
FIG. 28 is a perspective view of an embodiment of a container positioned on a rack.
Figure 29:
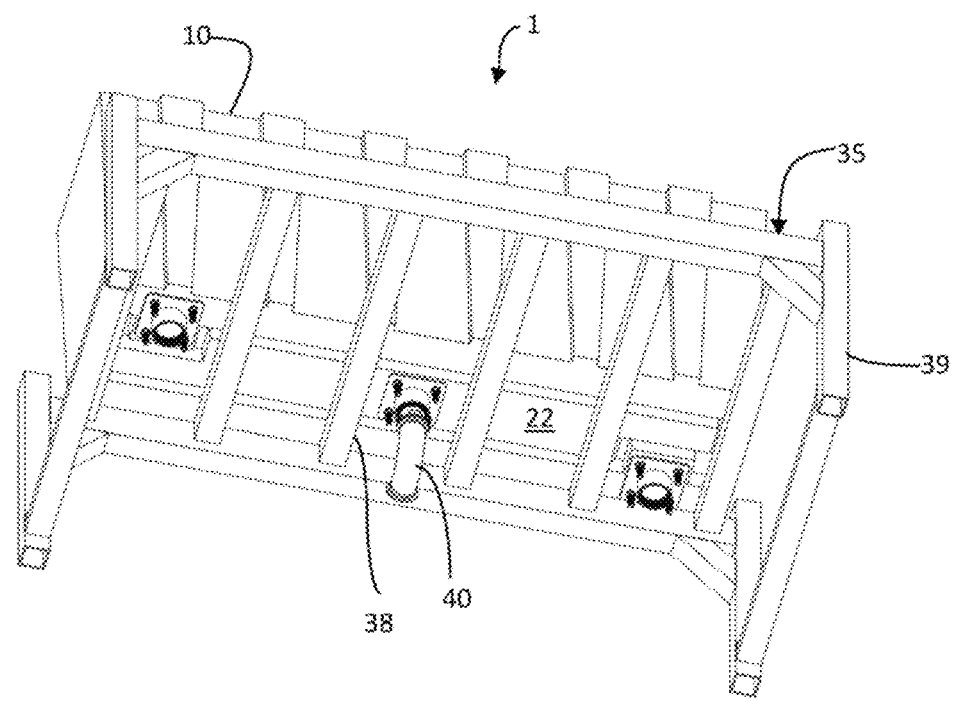
FIG. 29 is a perspective bottom view of an embodiment of a container positioned on a rack, depicting the dielectric liquid inlets and outlets positioned on the bottom surface of the container and being disposed between the slats of the rack.
Figure 30:
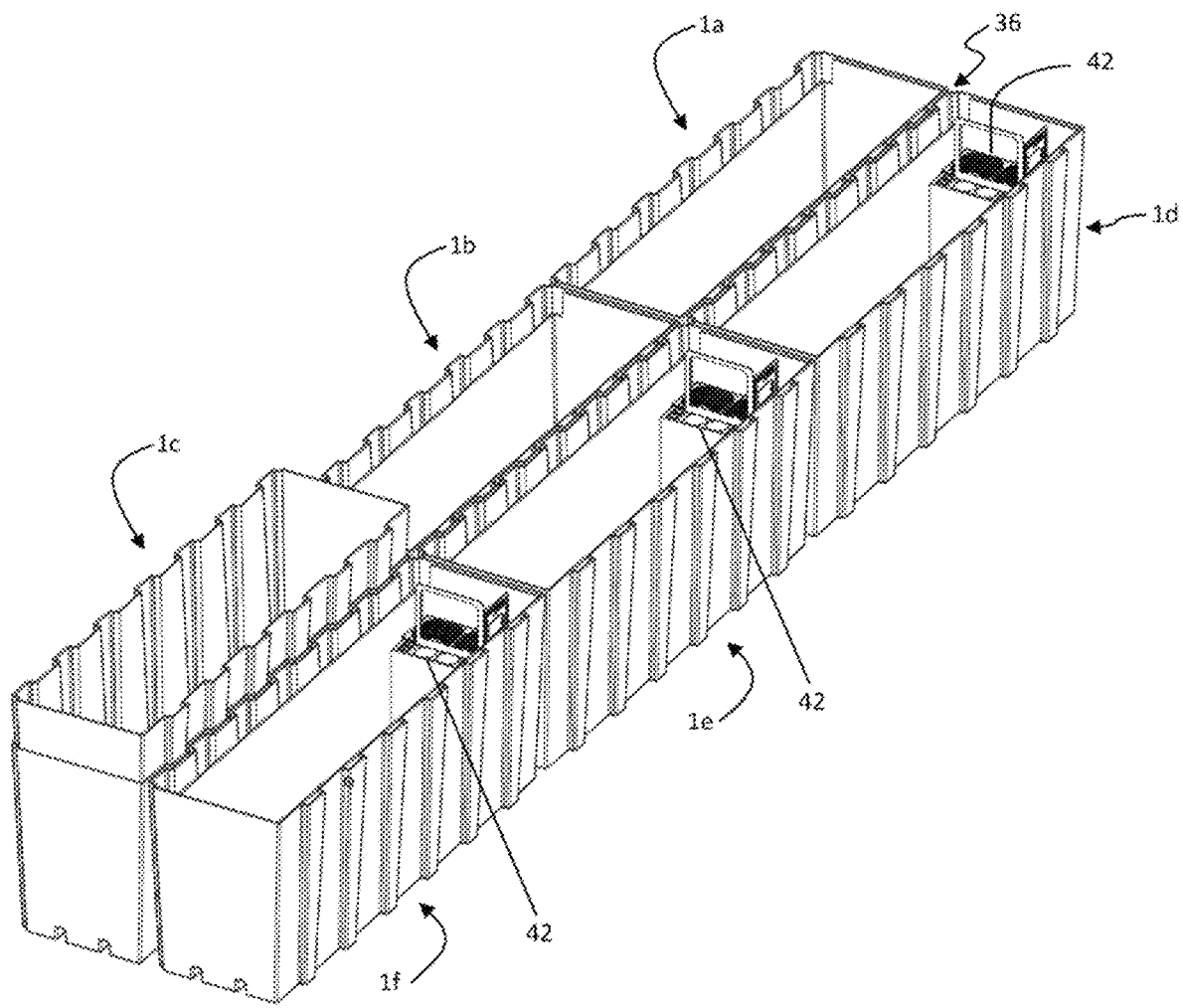
FIG. 30 is a perspective view of an exemplary array of six containers.
Figure 31:
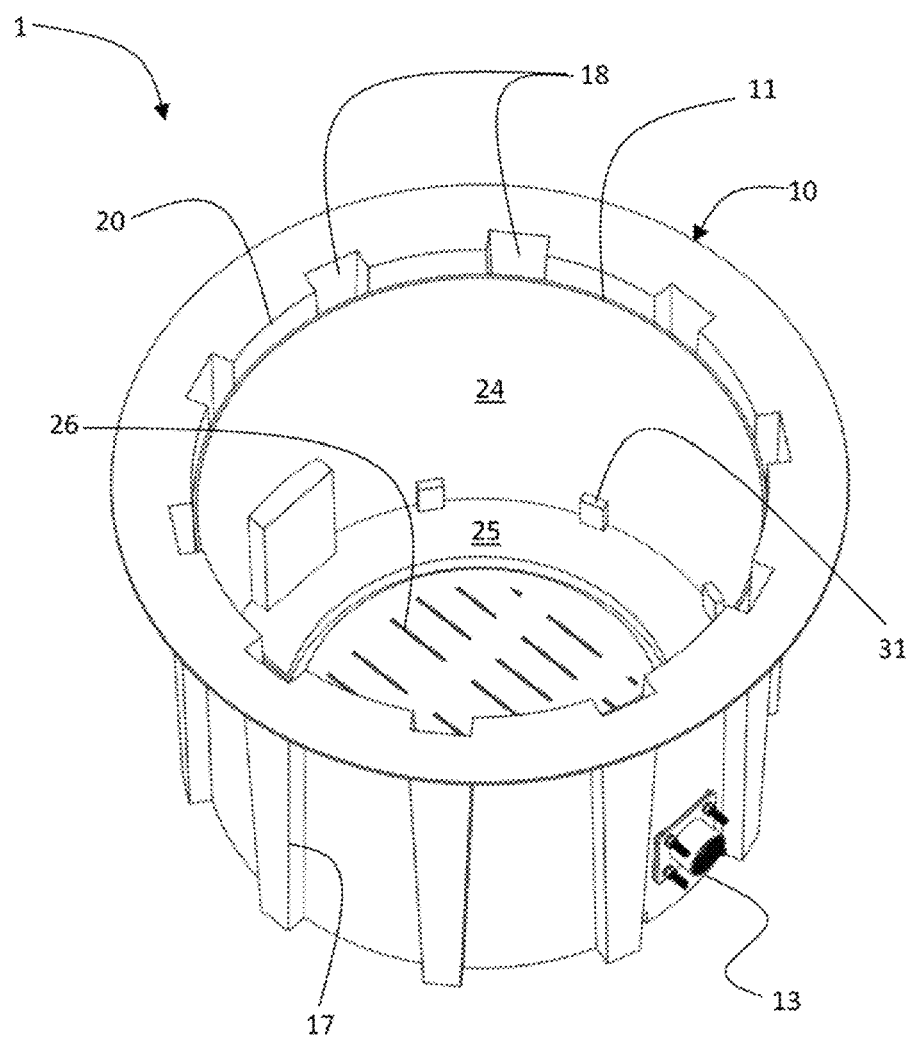
FIG. 31 is a perspective view depicting an embodiment of a container having a circular shape.

Referring to FIGS. 28 and 29, in an embodiment, the rack 35 has a plurality of slats 38 configured to support one or more containers 1 seated thereon. FIG. 29 depicts that the slats 38 are arranged such that the inlet(s) 13 and outlet(s) 14 are positioned within the spaces between the slats 38. The rack 35 has legs 39 configured to elevate the container 1, thereby creating sufficient clearance between the tank bottom 22 and the support surface to accommodate conduits 40 attached to the inlet(s) 13 and outlet(s) 14 for carrying the dielectric liquid to and from the container 1.

Figure 24:
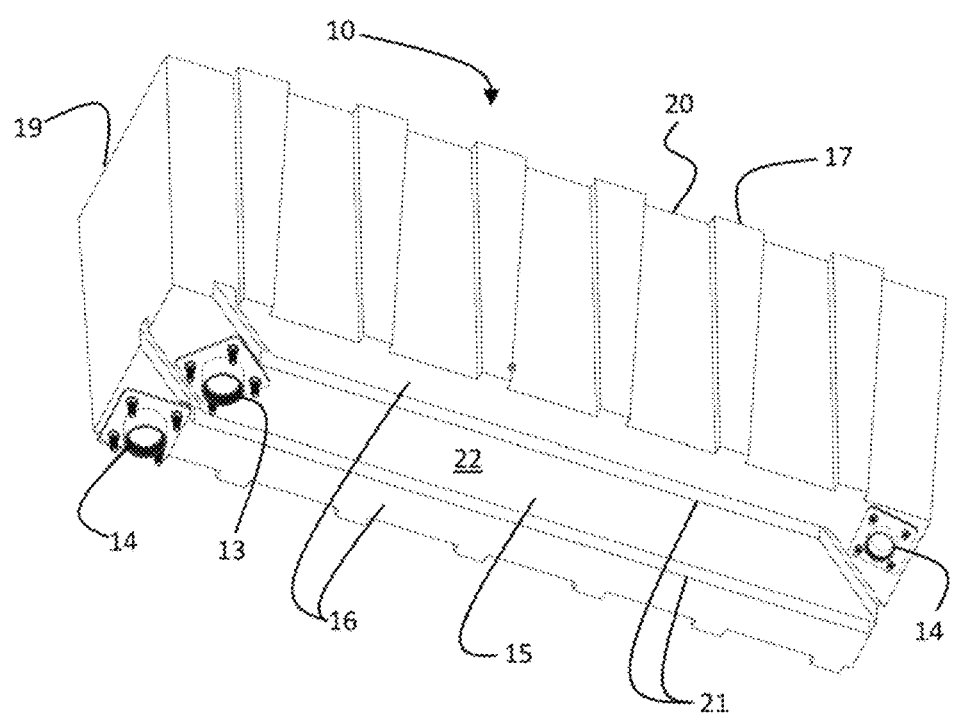
FIG. 24 is a perspective bottom view of an embodiment of a container having an alternative divider configuration for cooling an irregularly shaped object.

In other embodiments, the container 1 can comprise one or more inlets 13 or outlets 14 coupled to either end wall 19 or sidewall 20 of the tank 10, while one or more inlets 13 or outlets 14 may be coupled to the tank bottom 22. As shown in FIG. 24, the location and orientation of the dividers 21, which define the configurations of the inflow channel 15 and the outflow channels 16, can be customized to provide efficient cooling to a variety of objects having various shapes. This customization may be applied to customize the configuration of the container 1 for efficient cooling of irregularly shaped objects.

Figure 25:
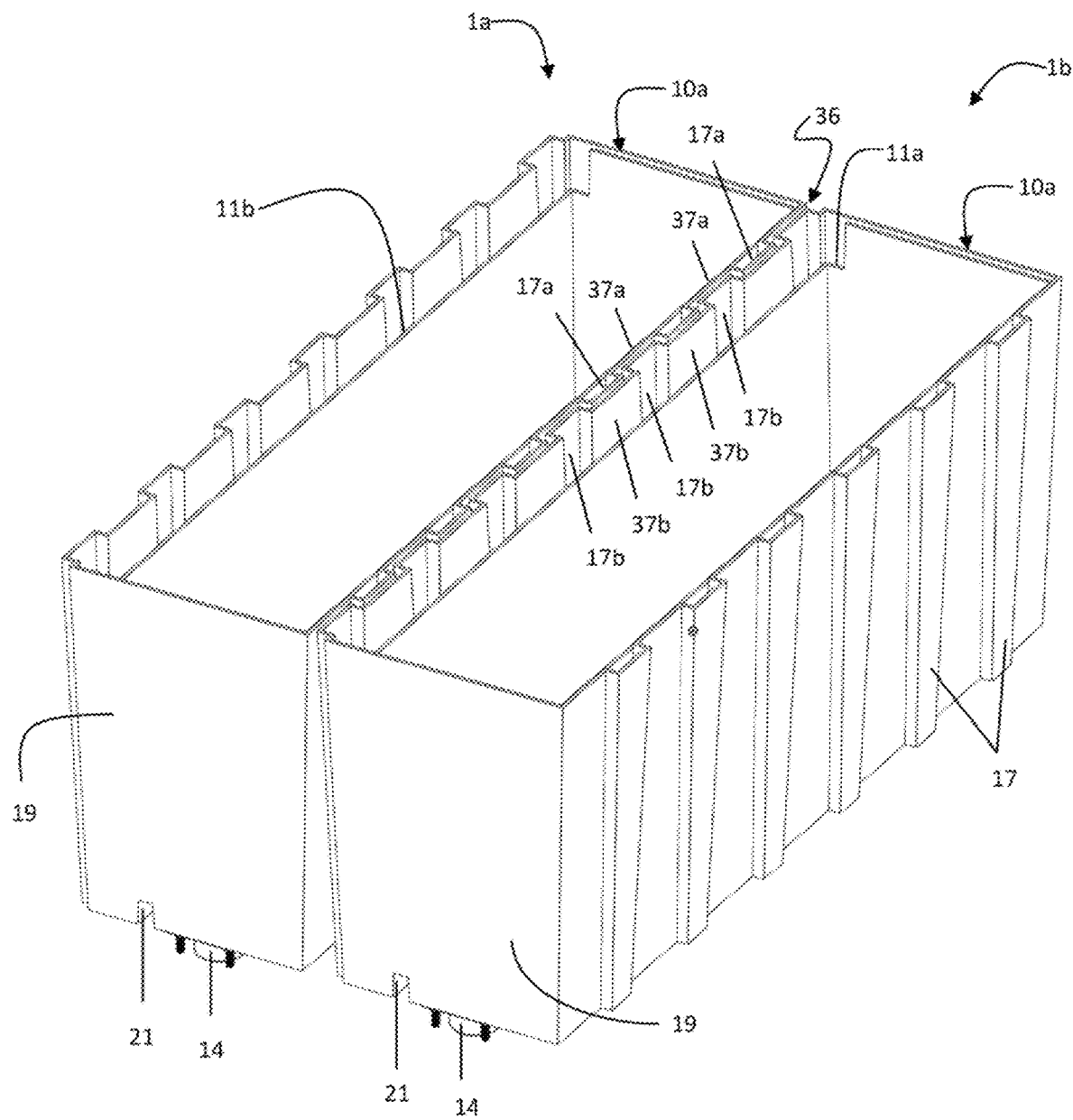
FIG. 25 is a perspective view depicting two containers according to an embodiment configured for lateral stacking, wherein the containers are positioned in a side-by-side arrangement, such that their respective corrugations and receiving channels are in a mated configuration.
Figure 26:
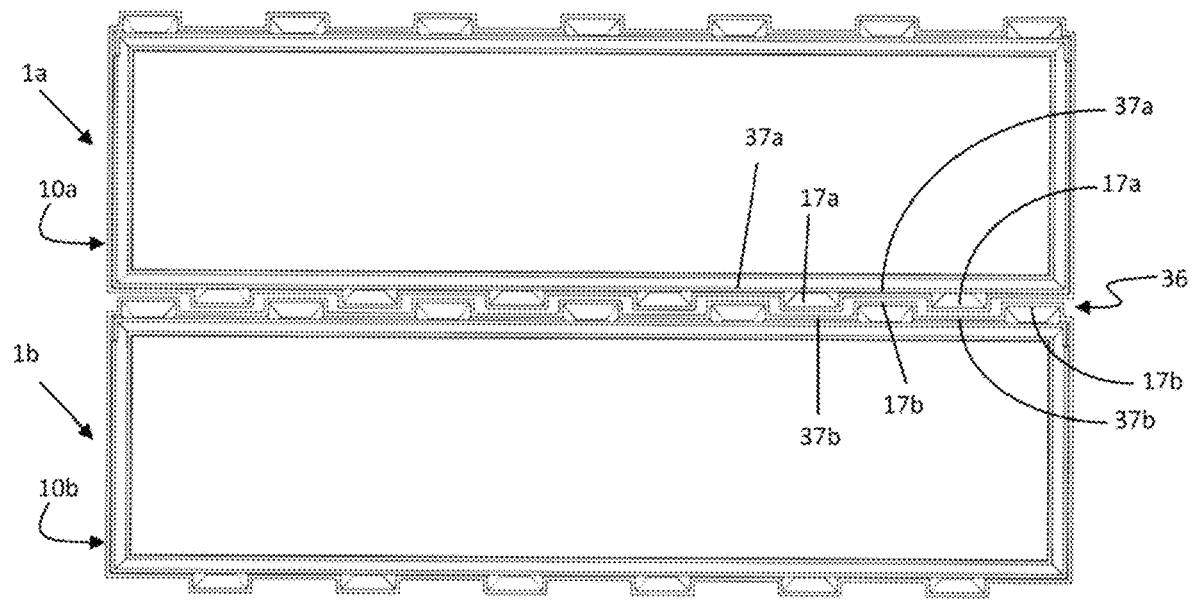
FIG. 26 is a top view depicting two containers according to an embodiment configured for lateral stacking, wherein the containers are positioned in a side-by-side arrangement, such that their respective corrugations and receiving channels are in a mated configuration.
Figure 27:
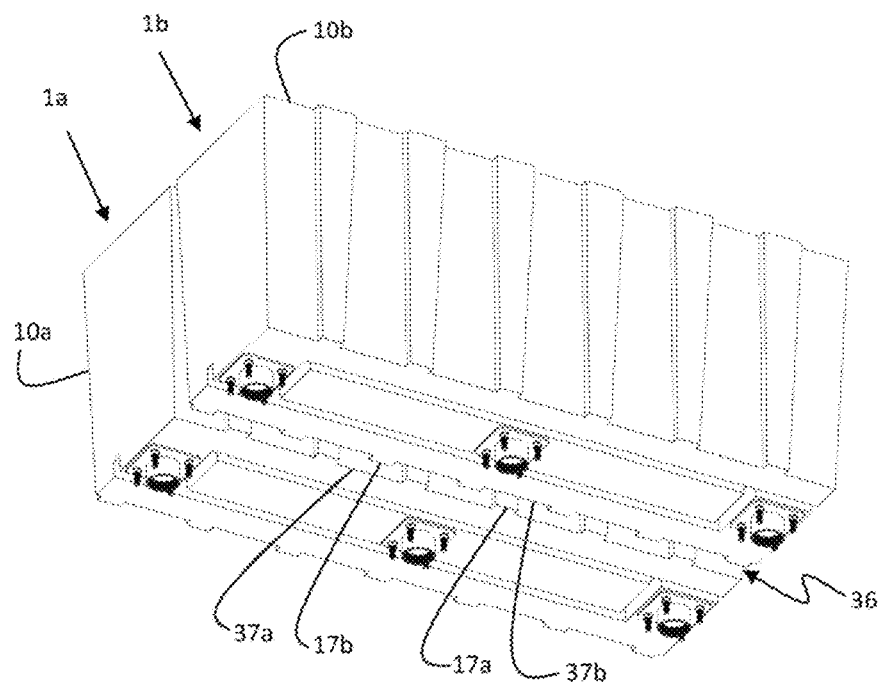
FIG. 27 is a perspective bottom view of depicting two containers according to an embodiment configured for lateral stacking, wherein the containers are positioned in a side-by-side arrangement, such that their respective corrugations and receiving channels are in a mated configuration.

Referring to FIGS. 25-27, the liquid dielectric immersion cooling containers 1 may be configured to be arranged in an array, wherein two or more containers 1 are arranging in a mating relationship with one another in a substantially planar orientation. In this embodiment, corrugations 17a of a first container 1a are disposed between the corrugations 17b of a second container 1b, defining a mating interface 36 between the first container 1a and the second container 1b.

In this embodiment, exterior spaces between adjacent corrugations 17a of the first tank 10a define receiving channels 37a configured to accept corrugations 17b of the second tank 10b. In this manner, the first tank 10a comprises a plurality of receiving channels 37a for receiving corrugations 17b of the second container 10b, while the second tank 10b comprises a plurality of receiving channels 37b for receiving corrugations 17a of the first tank 10a. This configuration enables the sidewalls of containers 10a and 10b to be mated with one another. Multiple containers 1 can be arranged in an array by mating their respective corrugations 17 and channels 37 defined therebetween. An example of an array of six containers 1a-1f is depicted in FIG. 30. The containers 1 avail themselves to being arranged in various arrays, enabling efficient and space-saving stacking configurations.

FIG. 30 depicts that equipment, or an electronic object 42—such as computer servers, crypto currency miners, batteries, etc.—can be placed containers 1 to be cooled by the dielectric liquid. As explained above, the shapes of containers 1 and dividers 21 and locations of the inlets 13 and outlets 14 can be customized to efficiently accommodate various shapes of objects 42. Furthermore, by arranging containers 1 in arrays, the conduits 40 carrying the dielectric liquid can also be arranged efficiently—for example, in straight lines—and can be coupled to the appropriate inlets 13 and outlets 14 of containers 1.

One embodiment of the container 1 is generally rectangular, or box-like, in shape, and it comprises at least one inlet 13 and at least one outlet 14 for circulating the dielectric liquid coolant through the container 1. The embodiment shown in FIG. 1 is generally rectangular in a top planar view (in the L-W plane). However, other embodiments of the container could have a circular, triangular, hexagonal, or an irregular shape in top planar view, as described in more detail below.

FIGS. 31-34 depict container 1 having a generally circular shape in the top planar view. In this embodiment, container 1 includes a tank 10 and a liner 11. The sidewall 24 of the liner 11 is disposed in an abutting contact with the interior of the sidewall 20 of the tank 10. The tank 10 includes a plurality of corrugations 17, the interior surface of which defines flow channels 18.

Figure 32:
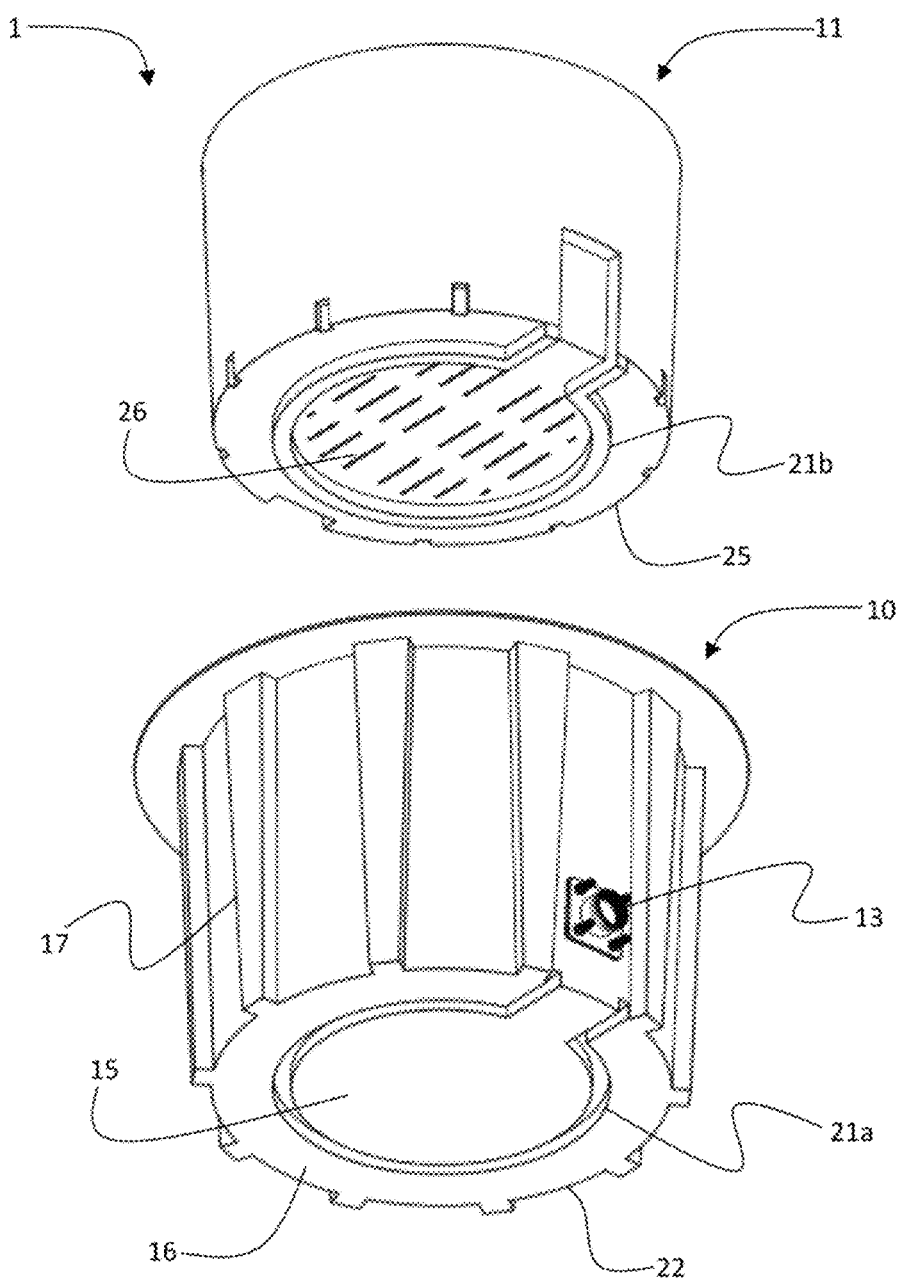
FIG. 32 is a bottom perspective exploded view of the embodiment depicted in FIG. 31.
Figure 33:
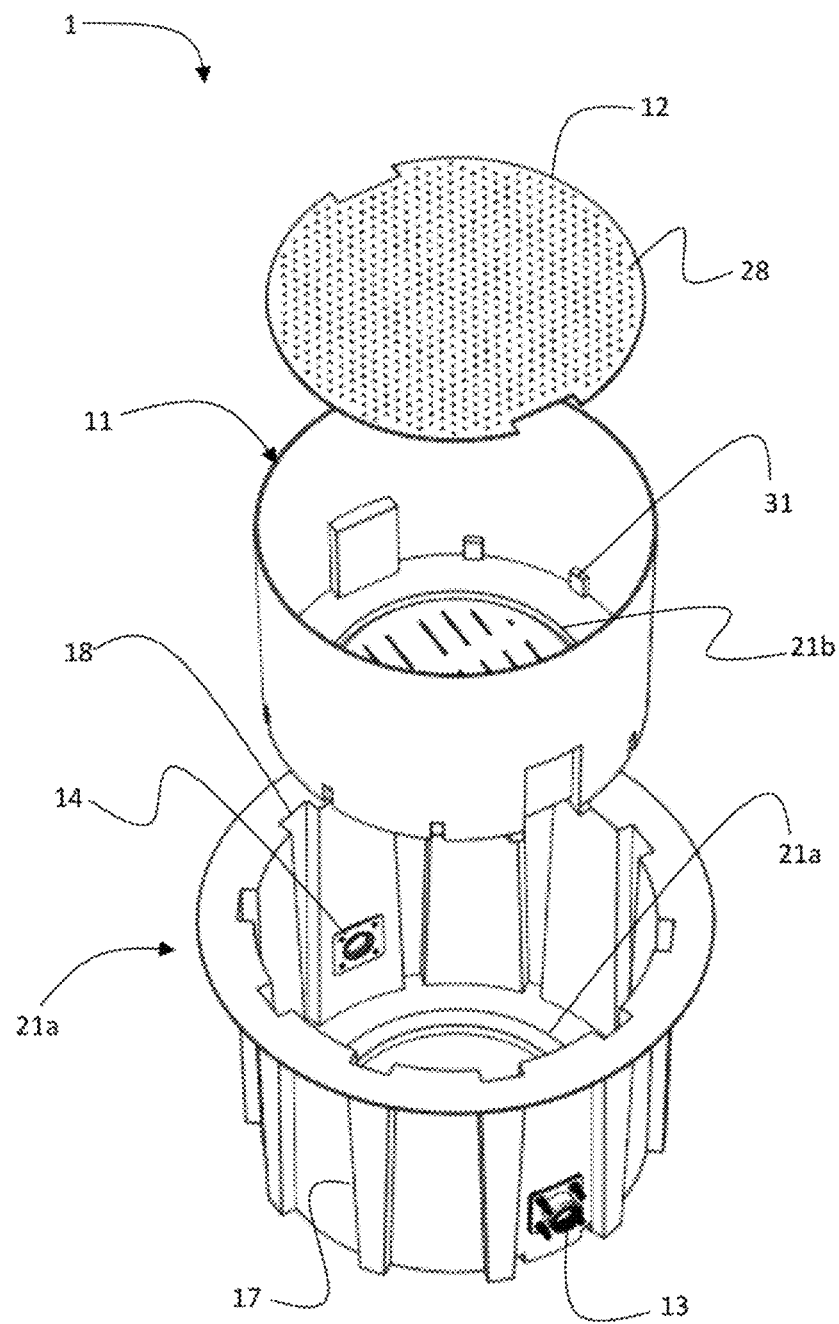
FIG. 33 is a top perspective exploded view of the embodiment depicted in FIG. 31.

An inlet 13 is coupled to sidewall 20 of the tank 10, thereby enabling pressurized dielectric liquid to flow into the first interior volume of the tank 10. FIG. 32 depicts that the interior surface of the tank bottom 22 has a divider 21a, while the exterior surface of the liner bottom 25 has a corresponding divider 21b. When the liner 11 is seated within the tank 10, the dividers 21a and 21b are disposed in contact with each other to form a liquid-impermeable seal at the interface thereof, thereby defining an inflow channel 15 and an outflow channel 16. The inflow channel 15 is in fluid communication with the inlet 13, while the outflow channel 16 is in fluid communication with the outlet 14.

Figure 34:
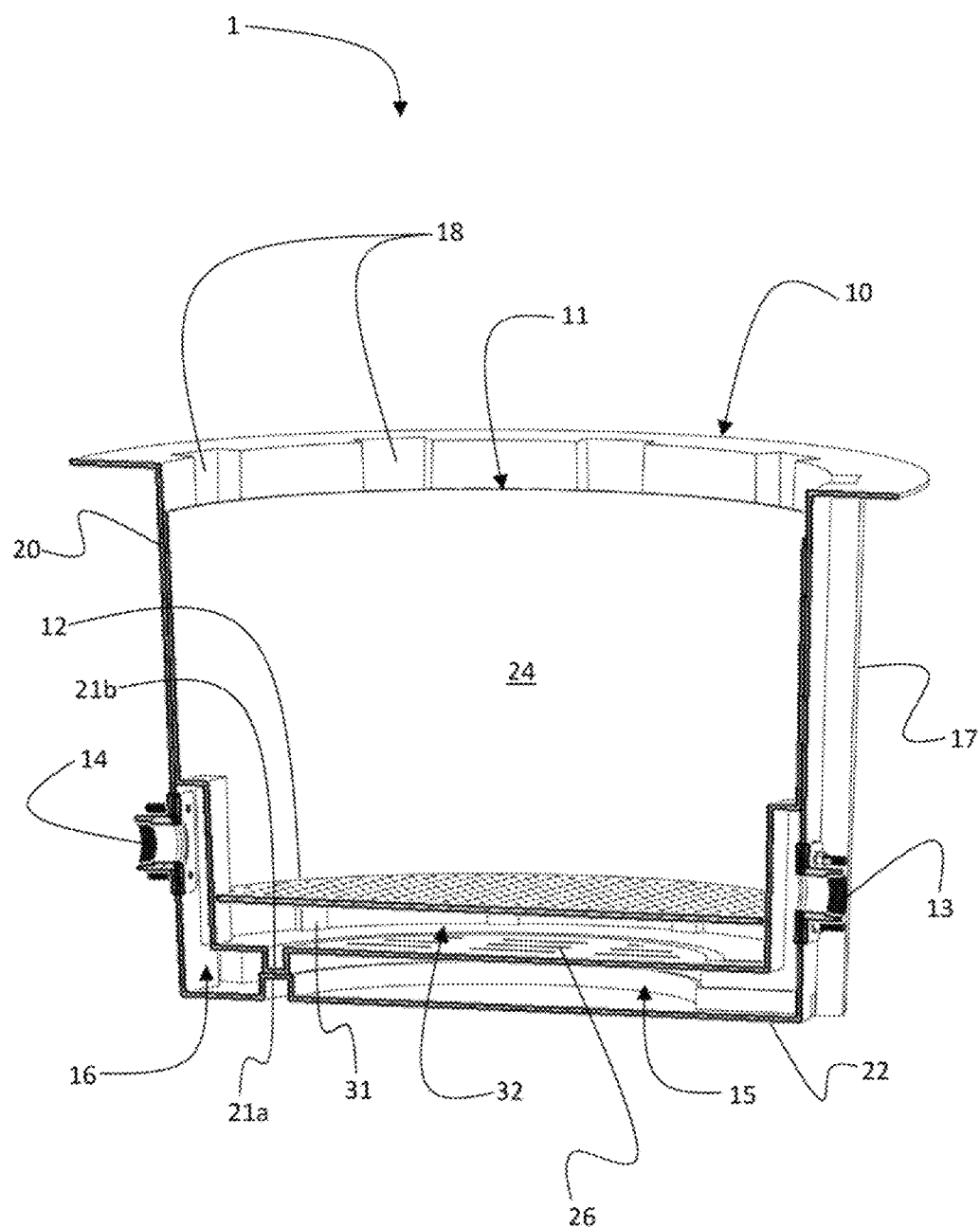
FIG. 34 is a cross-sectional perspective view of the embodiment depicted in FIG. 31.
Figure 35:
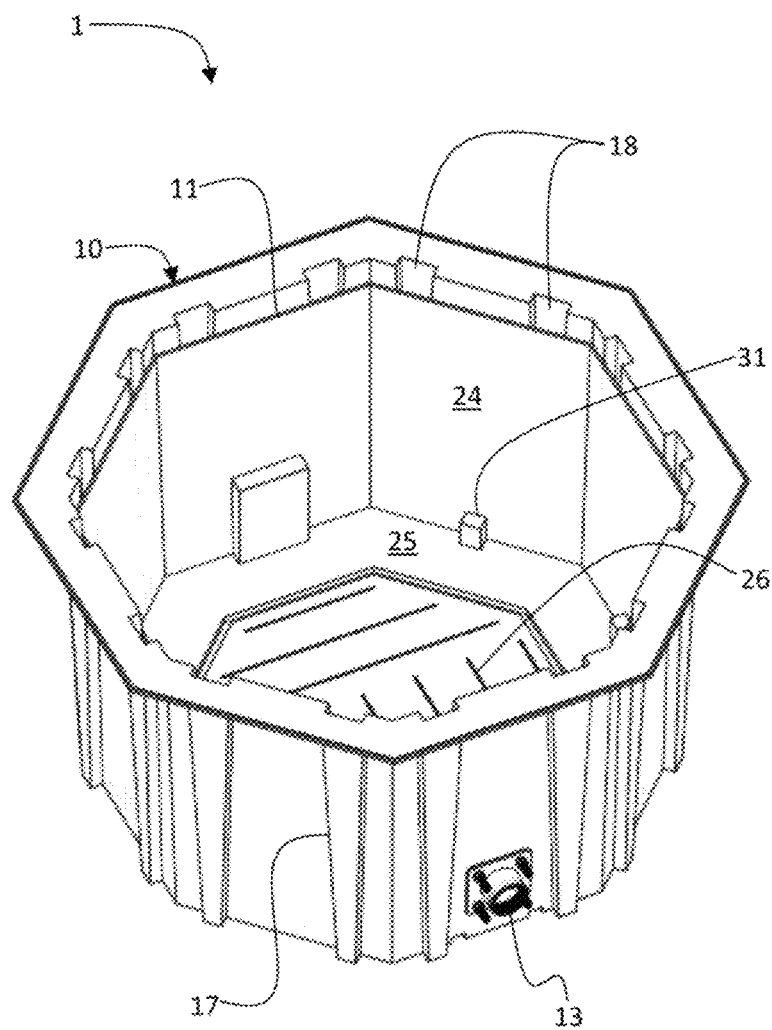
FIG. 35 is a perspective view depicting an embodiment of a container having an octagonal shape.
Figure 36:
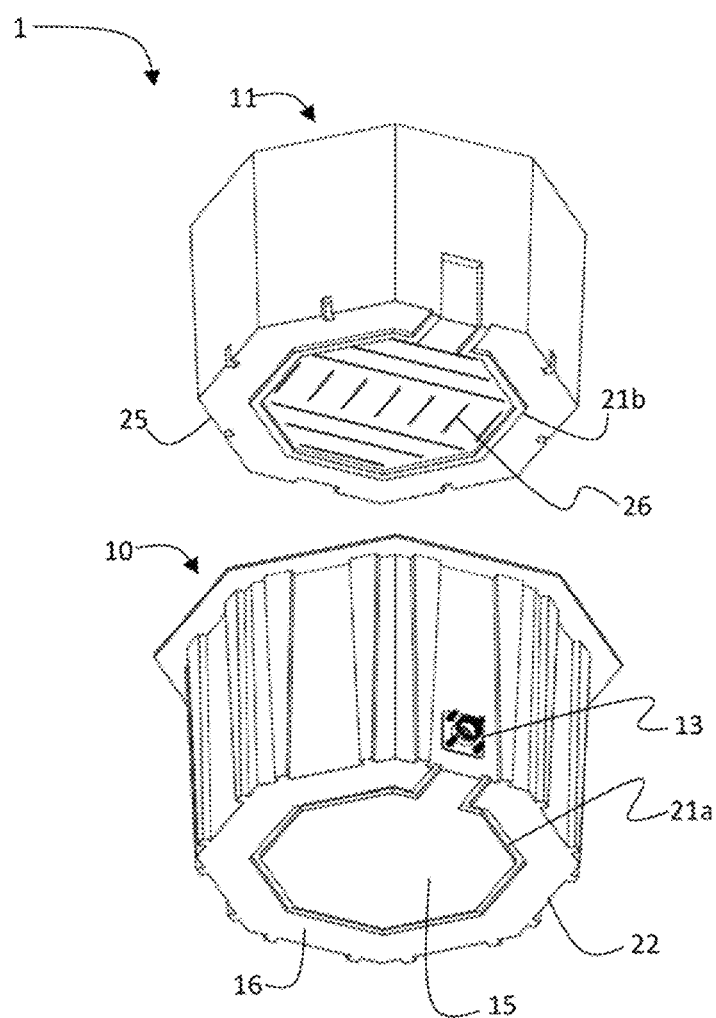
FIG. 36 is a bottom perspective exploded view of the embodiment depicted in FIG. 35.
Figure 37:
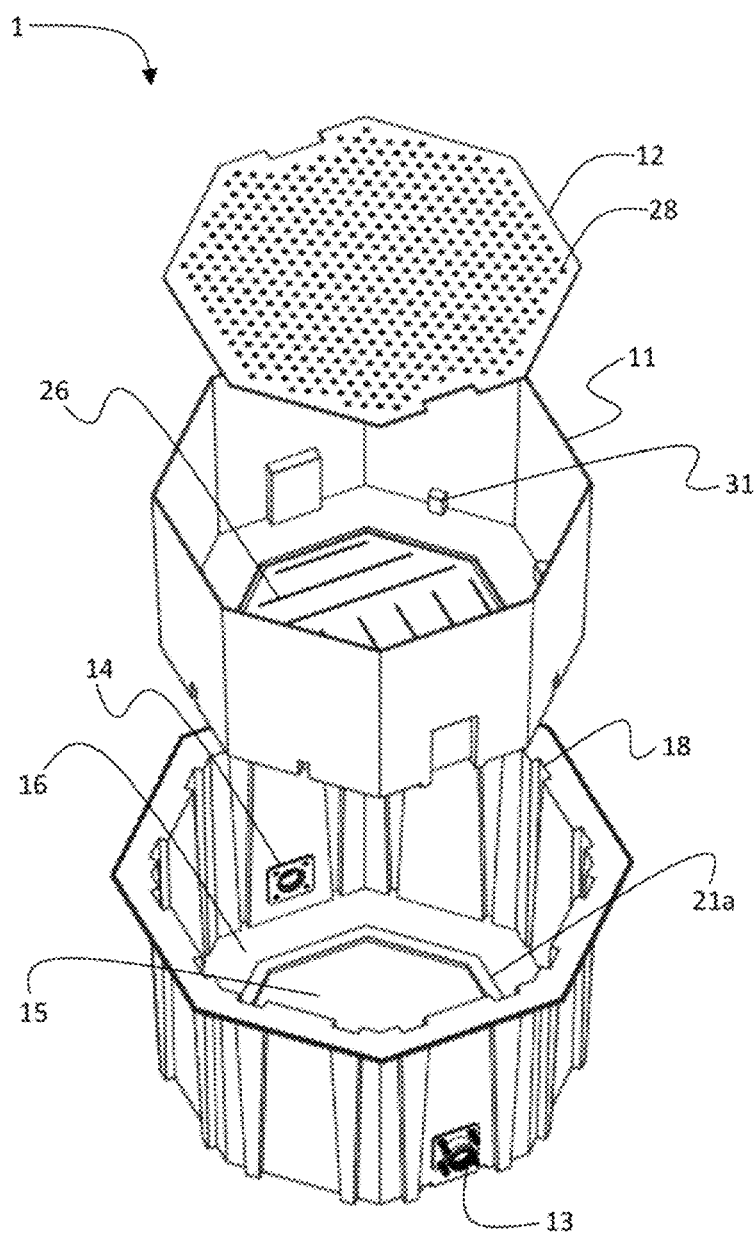
FIG. 37 is a top perspective exploded view of the embodiment depicted in FIG. 35.
Figure 38:
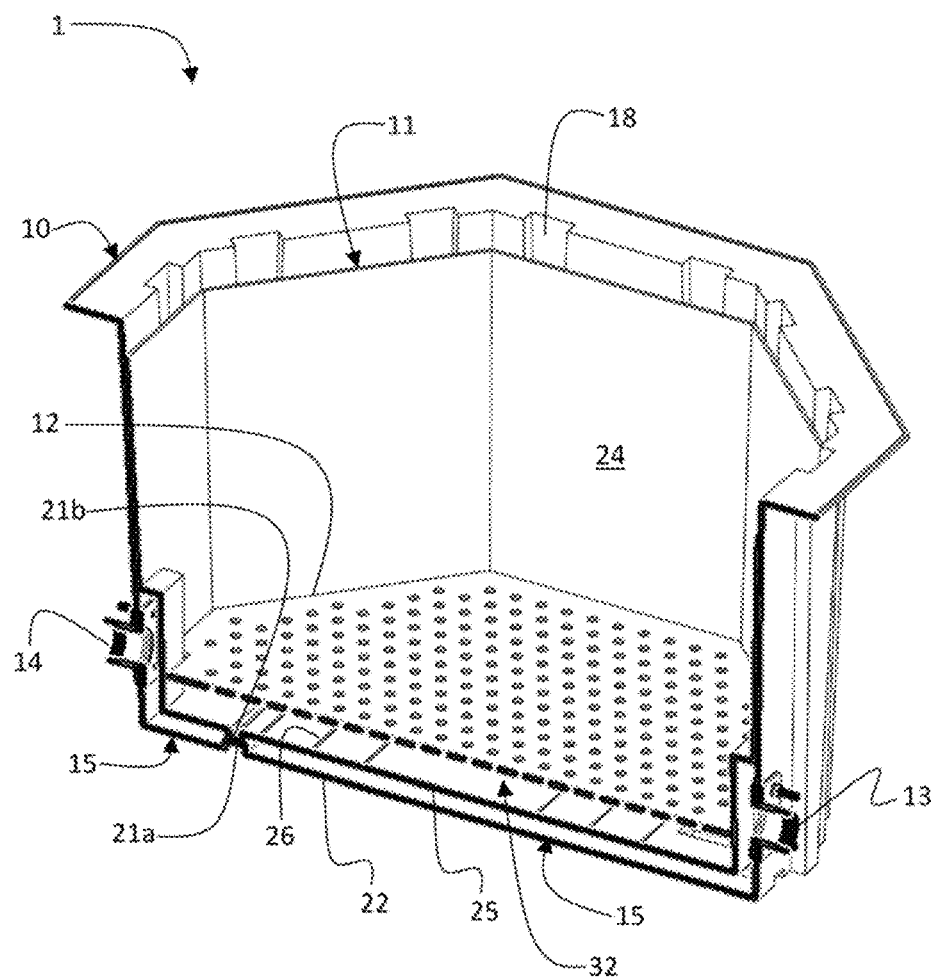
FIG. 38 is a cross-sectional perspective view of the embodiment depicted in FIG. 35.

As most clearly depicted in FIG. 34, dielectric liquid enters the inflow channel 15 via the inlet 13. The dielectric liquid rises through the liner vents 26 and fills the chamber 32 formed between the liner bottom 25 and the support base 12, which is seated on the shoulders 31 disposed within the liner 11. The dielectric liquid rises through the vents 28 of the support base 12 and fills the second interior volume of the liner 11, whereby one or more objects positioned therein become immersed into the dielectric liquid. In this manner, heat is transferred from the one or more objects to the dielectric liquid. As the liquid level continues to rise and exceeds the height of the liner sidewall 24, the liquid spills over the liner sidewall 24 and into the flow channels 18. The flow channels 18 direct the dielectric liquid into the outflow channel 16, from which the dielectric liquid exits the tank 10. This continuous flow of the dielectric liquid enables efficient heat transfer and removal from the equipment housed within the container 1. In this manner, the dielectric liquid cools the equipment.

FIGS. 35-38 depict an embodiment of container 1 having an octagonal shape in a top planar view. This embodiment functions in the substantially the same manner as the circular embodiment described above.

Figure 39:
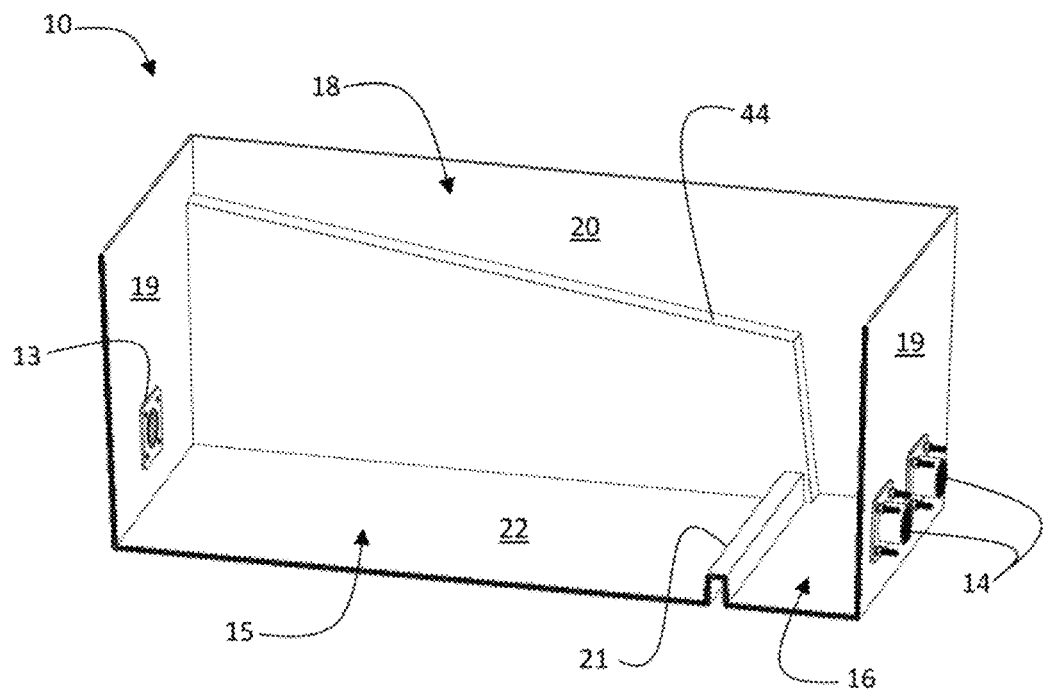
FIG. 39 is a cross-sectional perspective view of an embodiment of a tank having an interior ledge for directing the flow of the dielectric liquid toward outlets coupled to a tank end wall.
Figure 40:
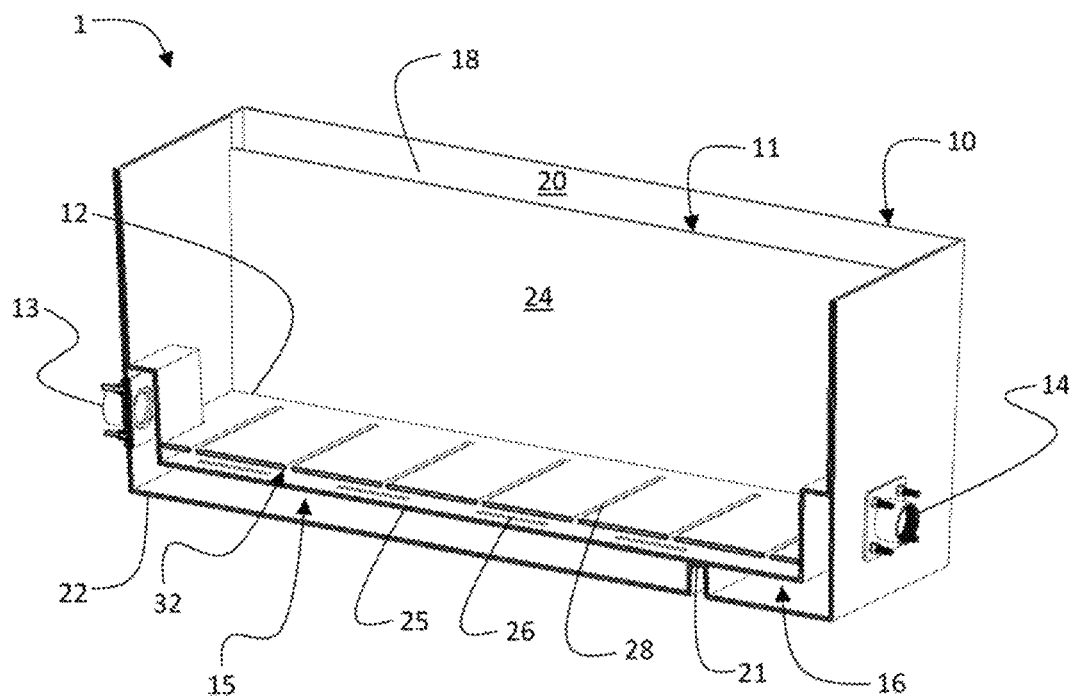
FIG. 40 is a cross-sectional perspective view of the embodiment depicted in FIG. 39, further depicting a liner and a support base disposed within the tank.
Figure 41:
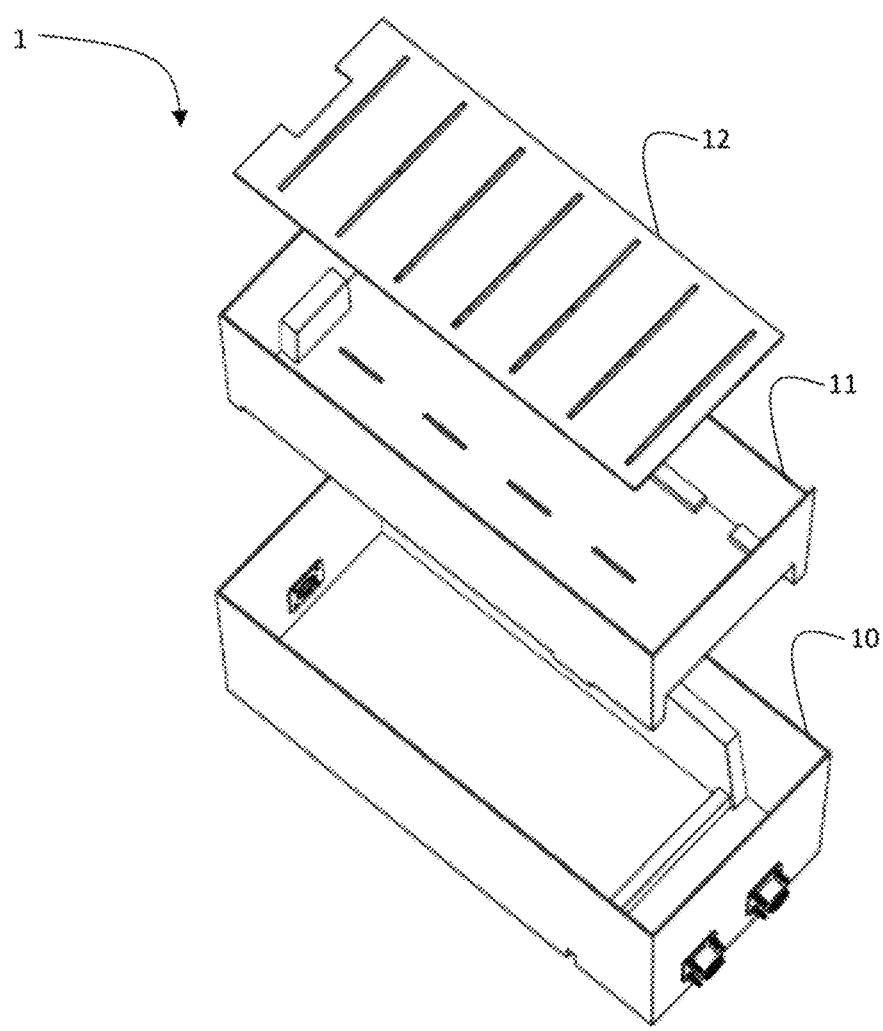
FIG. 41 is a top perspective exploded view of the embodiment depicted in FIG. 40.
Figure 42:
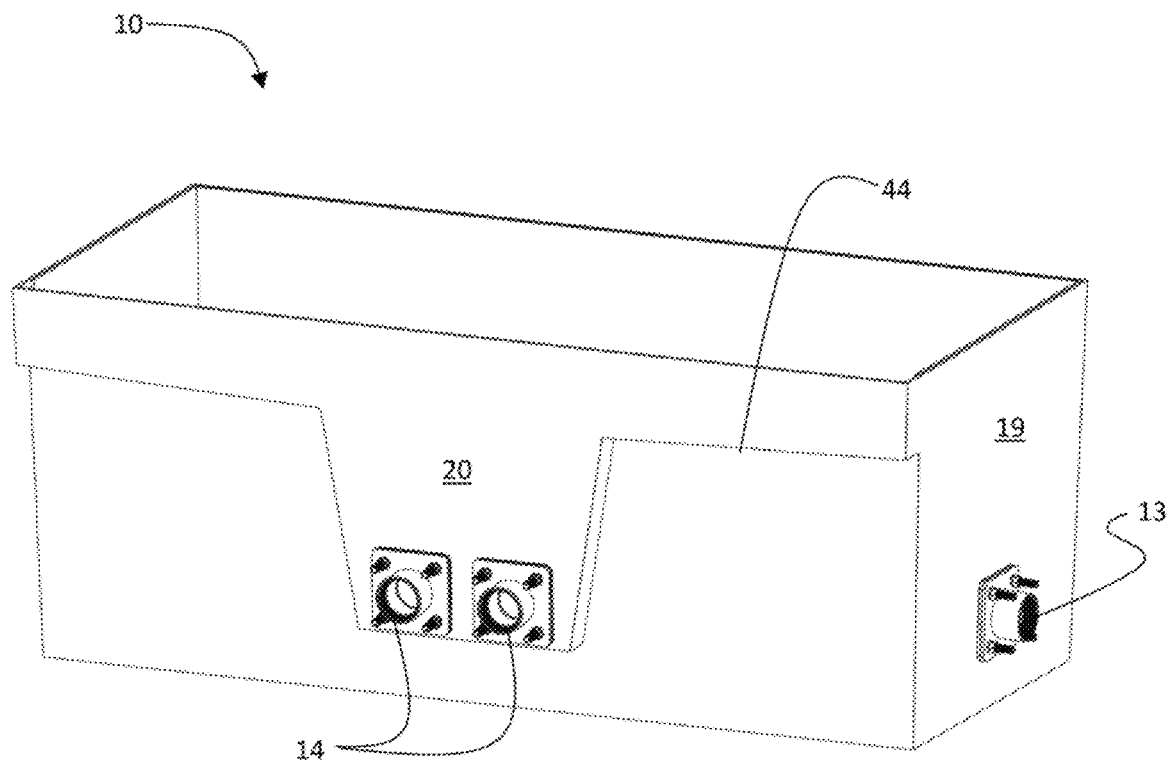
FIG. 42 is a perspective view of an embodiment of a container having interior ledges for directing the flow of the dielectric liquid toward outlets coupled to a tank sidewall.
Figure 43:
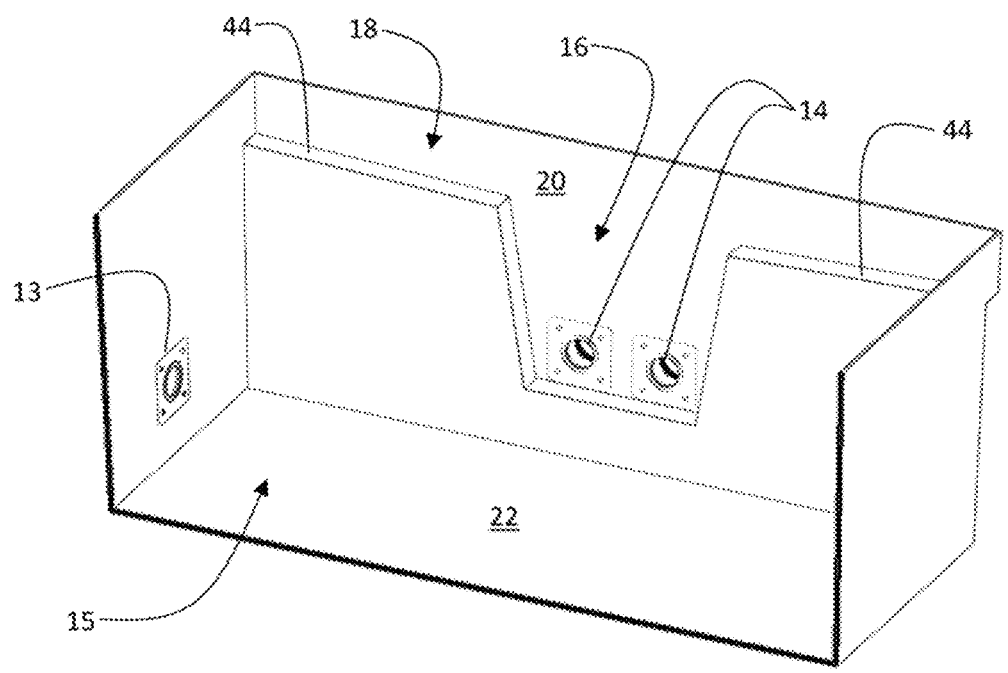
FIG. 43 is a cross-sectional perspective view of the tank embodiment depicted in FIG. 42.
Figure 44:
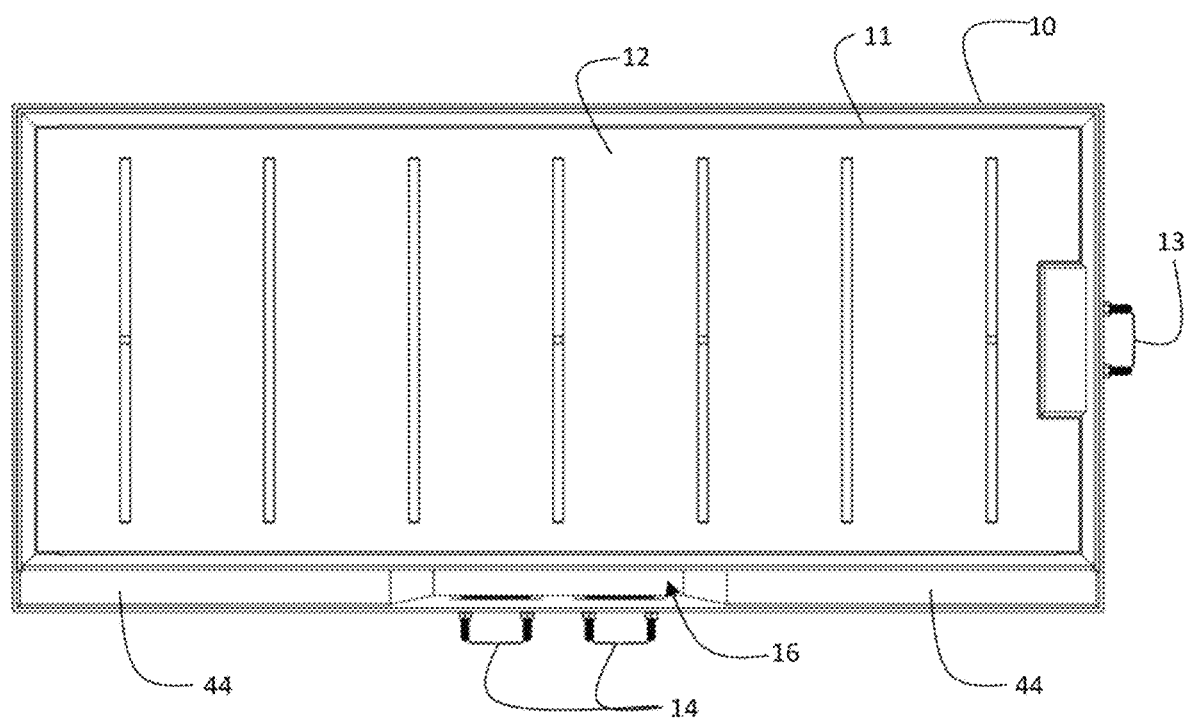
FIG. 44 is a top view of the assembled container embodiment depicted in FIG. 42.
Figure 45:
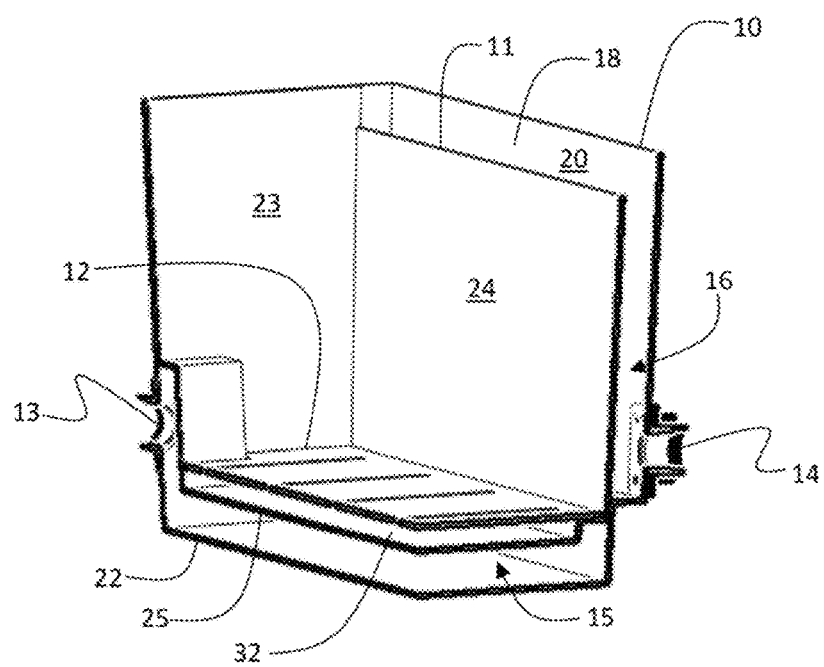
FIG. 45 is a cross-sectional perspective view of the tank embodiment depicted in FIG. 42.
Figure 46:
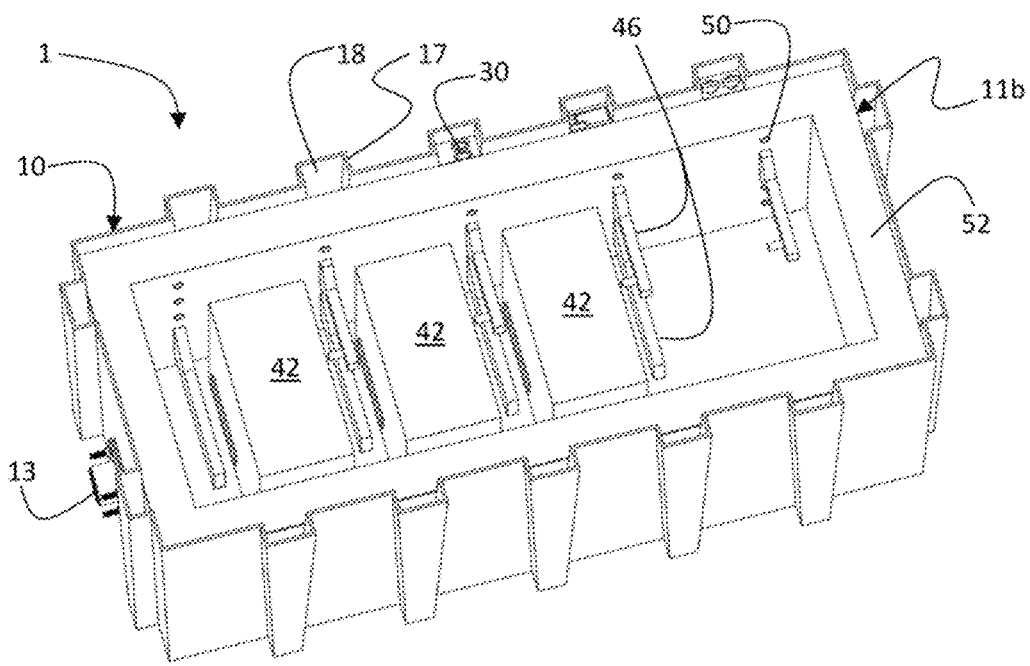
FIG. 46 is a perspective top-left view of an embodiment of a container utilizing directional nozzles for directing the dielectric fluid flow to a target area of an object placed within the container.
Figure 47:
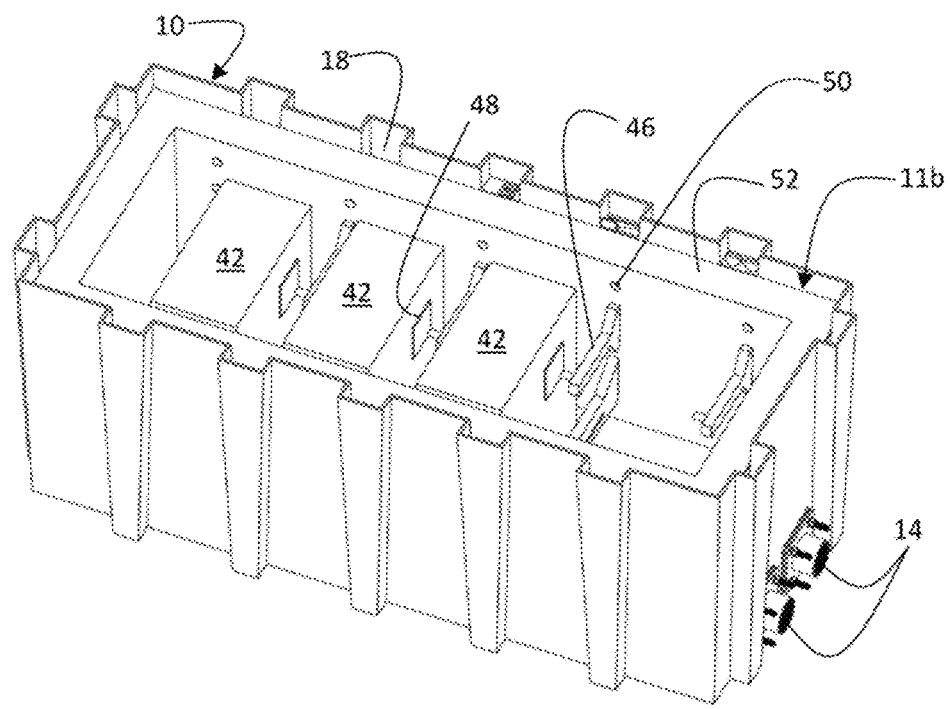
FIG. 47 is a perspective top-right view of the embodiment depicted in FIG. 46.
Figure 48:
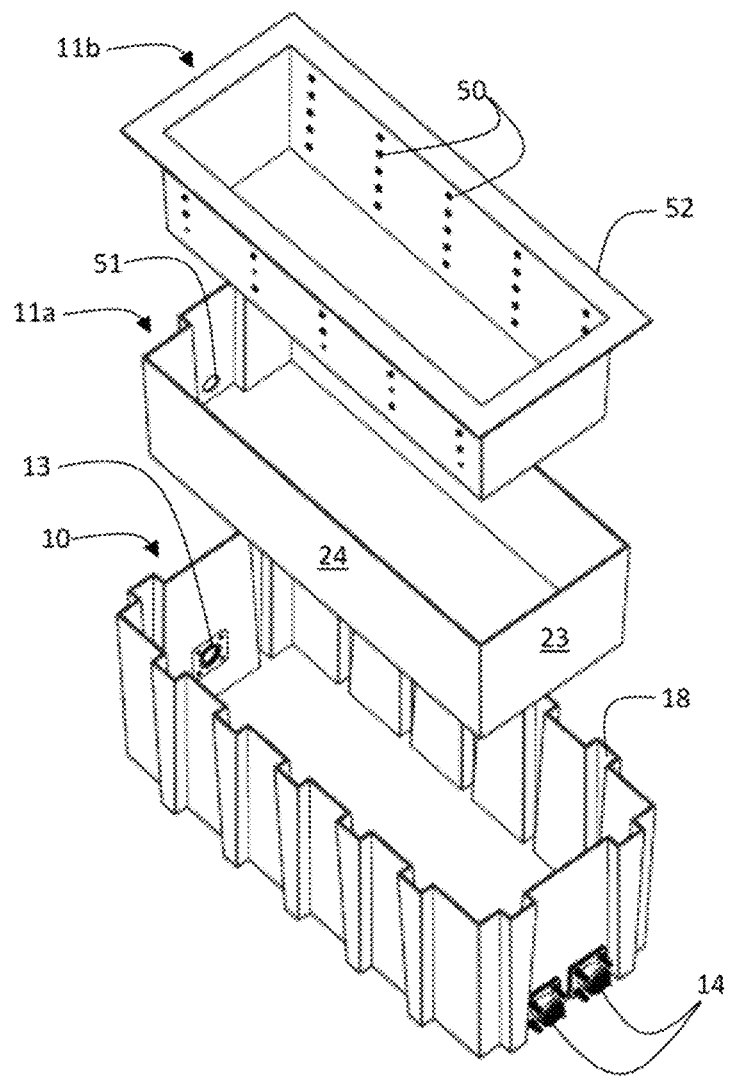
FIG. 48 is a top perspective exploded view of the embodiment depicted in FIG. 46.
Figure 49:
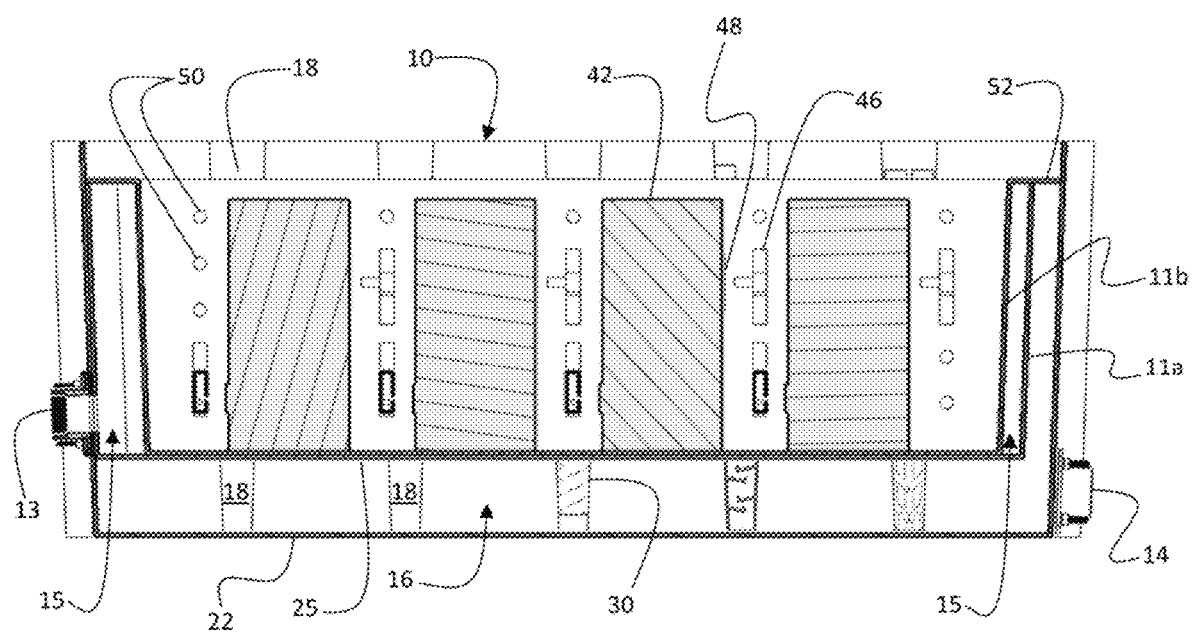
FIG. 49 is a cross-sectional front view of the embodiment depicted in FIG. 46.
Figure 50:
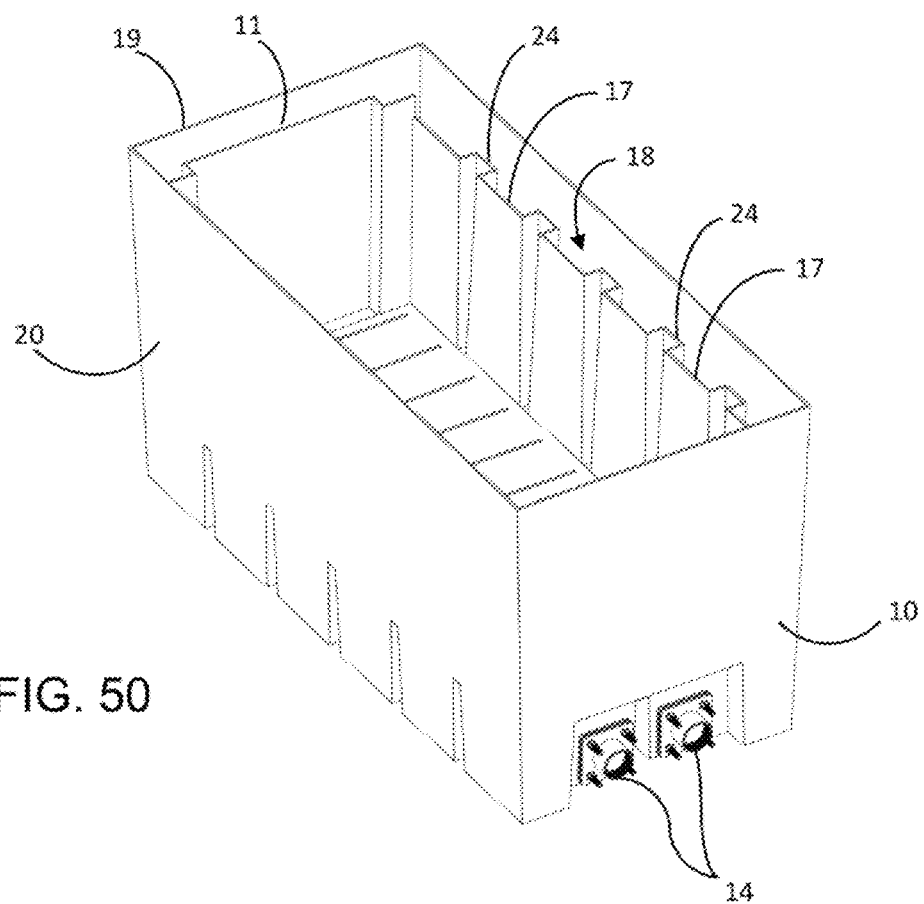
FIG. 50 is a perspective view of an embodiment of a tank having corrugations disposed in the liner side wall.
Figure 51:
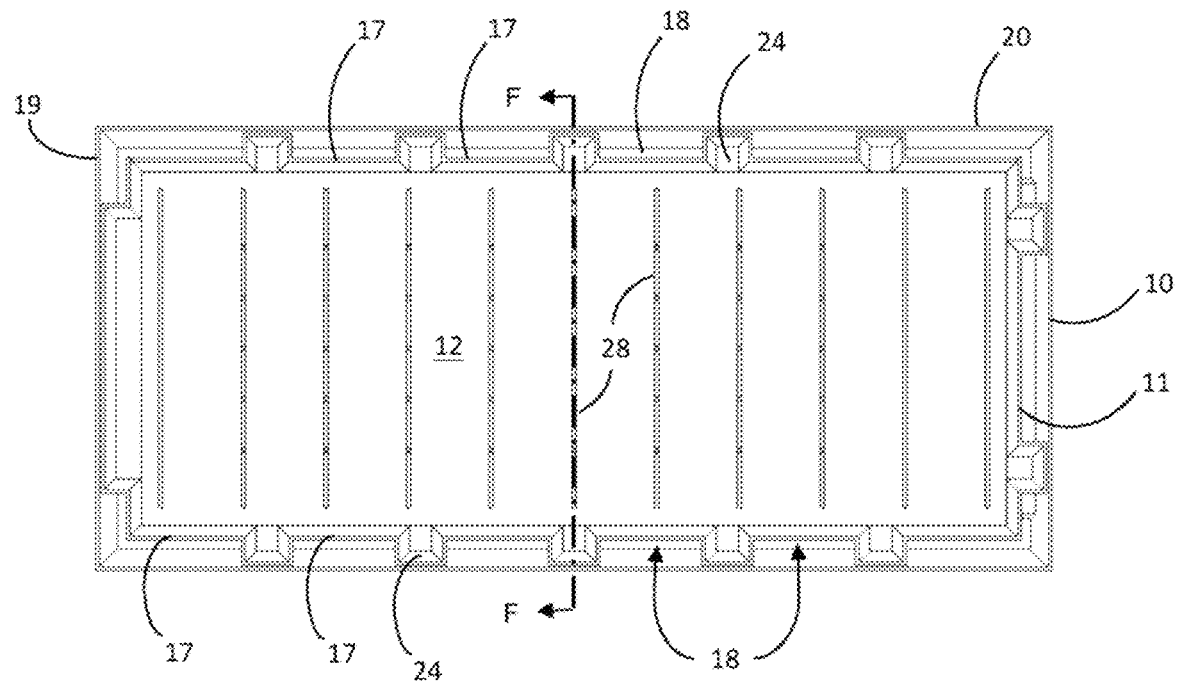
FIG. 51 is a top perspective view of the embodiment shown in FIG. 50.
Figure 52:
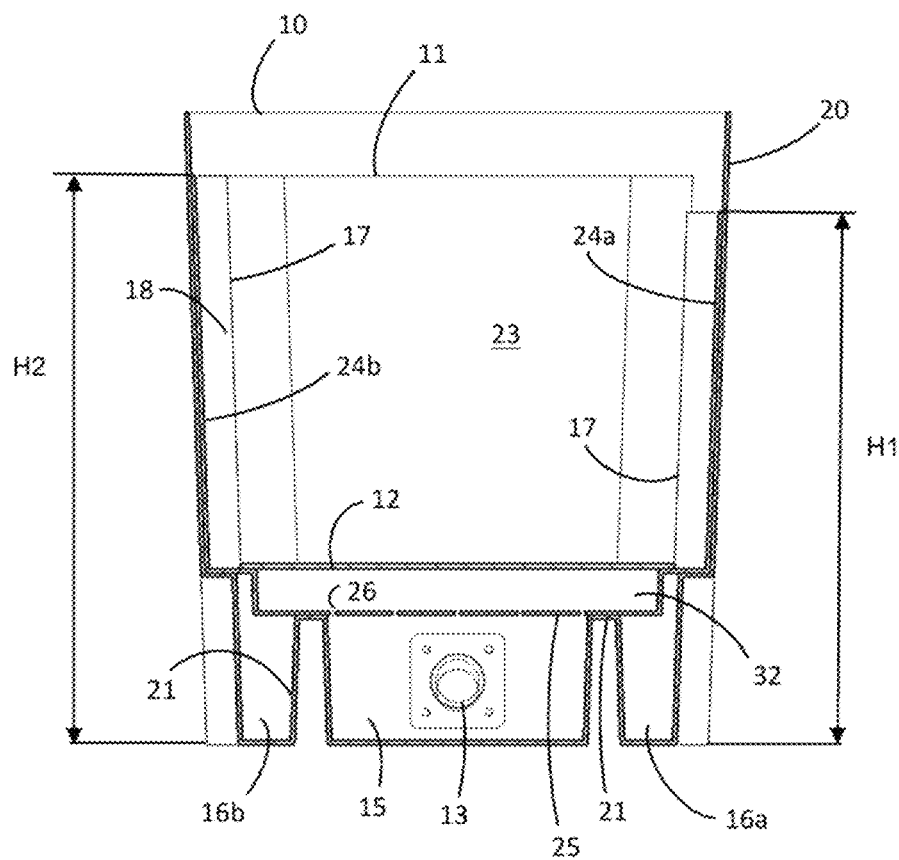
FIG. 52 is cross section F-F.
Figure 53:
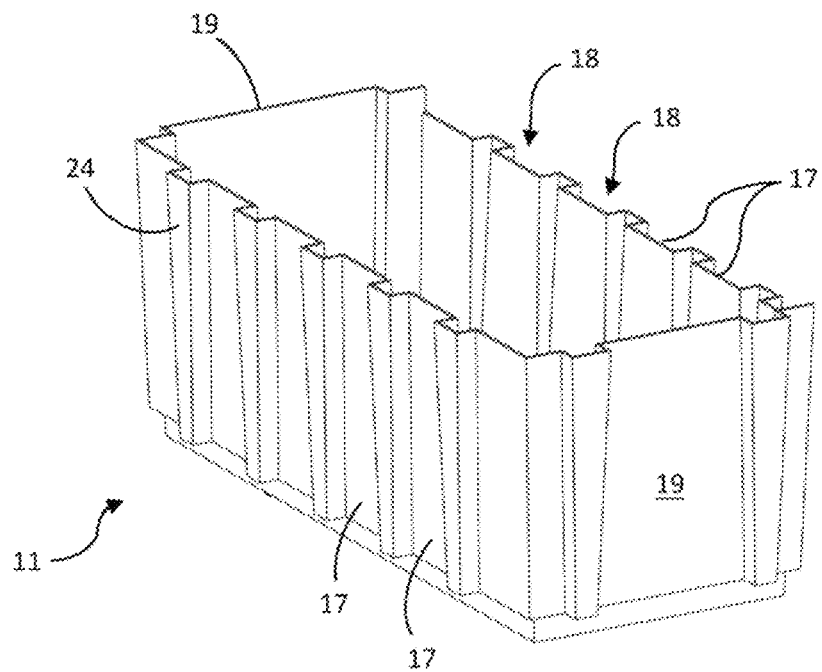
FIG. 53 is a perspective view of the liner of the embodiment shown in FIG. 50.

Another embodiment of the container 1 is depicted in FIGS. 39-41. Unlike the embodiments described above, tank 10 does not have corrugations defining flow channels. Instead, FIGS. 39 and 40 depict that the flow channel 18 formed between the interior surfaces of the tank sidewall 10 and an exterior surface of the liner sidewall 24. The tank 10 has a ledge 44 that facilitates the flow of the dielectric liquid into the outflow channel 16. When the liner 11 is positioned within the tank 10, a liquid-impermeable seal is established between the divider 21 disposed on the tank bottom 22 and the exterior surface of the liner bottom 25. In this manner the divider 21 partitions the bottom of the tank 10 into an inflow channel 15 and outflow channel 16. The inflow channel 15 is in fluid communication with the inlet 13, while the outflow channel 16 is in fluid communication with the outlets 14.

The container 1 depicted in FIGS. 39-41 operates according to the same principle of operation described with respect to other embodiments disclosed above. The dielectric liquid enters the inflow channel 15 via the inlet 13. The dielectric liquid rises and enters the chamber 32 formed between the liner bottom 25 and the support base 12 via the liner vents 26. As the dielectric liquid continues to rise, it flows into the second interior volume of the liner 11 via the vents 28 of the support base 12. FIG. 41 depicts that the liner vents 26 and the support base vents 28 may be disposed in an orthogonal orientation relative to one another.

As the dielectric liquid continues to flow through the support base vents 28, the liquid fills the second interior volume of the liner 11. When the liquid level rises above the sidewall 24, the liquid spills over into the flow channel 18 formed between the exterior surface of the liner sidewall 24 and the interior surface of the tank sidewall 20. Gravity causes the liquid to flow through the flow channel 18 as guided by the slope of the ledge 44 and into the outflow channel 16. From there, the dielectric liquid exits the tank 10 via the outlets 14. The continuous flow of the dielectric liquid removes the heat from an object seated on the support base 12 via heat exchange that occurs between the colder dielectric liquid and the warmer object. The heat is carried out of the container 1 as the warmed dielectric liquid exits the tank 10 via the outlets 14.

FIGS. 42-45 depict another embodiment of the container 1. Unlike other embodiments disclosed herein, the tank 10 does not have a divider 21 partitioning the bottom portion of the tank 10 into an inflow channel 15 and an outflow channel 16. Instead, the outflow channel 16 is established between the inner surface of the tank sidewall 20 and the exterior surface of the liner sidewall 24. The ledges 44 create flow channels 18, which direct the flow of the dielectric liquid into the outflow channel 16, which is coupled to the outlets 14, enabling the dielectric liquid to exit the tank 10.

FIGS. 46-49 depict an embodiment of the tank 1 that uses directional nozzles 46 to direct the flow of the dielectric liquid into the specific target area 48 on the object 42 to facilitate more efficient cooling of critical components or hotspots. This embodiment involves nested liners 11a and 11b, which are most clearly depicted in the exploded view in FIG. 48 and the cross-sectional view in FIG. 49. In this embodiment, the inflow channel 15 is formed within the volume enclosed between the liner 11a and the liner 11b, wherein the top edges of the sidewalls 24 and end wall 23 of the liner 11 form a liquid-impermeable seal with the underside of the top flange 52 of the liner 11b.

The liner 11b has a plurality of apertures 50 configured to fluidly couple to directional nozzles 46. The dielectric liquid enters the liner 11a from the inlet 13 via opening 51. The dielectric liquid then fills the inflow channel 15 formed between the interior surfaces of the sidewalls 24 and end walls 23 of the liner 11a and the corresponding exterior surfaces of the tank 11b. From the inflow channel 15, the dielectric liquid flows into the directional nozzles 46, which eject the dielectric liquid into target area 48. To further control the flow of the dielectric liquid, some or all of the apertures 50 that are not coupled to directional nozzles 46 may be closed with designated plugs, thereby directing the flow of the dielectric liquid exclusively through the nozzles 46.

As the dielectric liquid enters the third interior volume of the liner 11b, the liquid level rises, filling the third interior volume of the liner 11b and immersing the objects 42 into the dielectric liquid. When the dielectric liquid level exceeds the height of the sidewalls of the liner 11b, the dielectric liquid begins to spill over the sidewalls and the end walls of the liner 11b and into the flow channels 18 formed between the interior surface of the corrugations 17 and the exterior surface of the liner 11a. Flow regulators 30 may be disposed within one or more flow channels 18. Gravity causes the dielectric liquid to flow through flow channels 18 into the outflow channel 16, formed between the exterior surface of the liner bottom 25 and the interior surface of the tank bottom 22. The dielectric liquid exits that tank 10 via the outlets 14.

In all of the embodiments described above, a pump can be used to circulate the dielectric liquid through the container 1 and control the pressure and the flow rate of the dielectric liquid through the container 1. In addition, the dielectric liquid can be cooled upon exiting the container 1 and then the cooled dielectric liquid can reintroduced into the tank thereby maintaining circulation of cold dielectric liquid through the container 1.

FIGS. 50-54 depict another embodiment wherein the corrugations 17 are disposed in the liner side wall 24 of the liner 11. The liner side wall 24 surfaces between the corrugations 17 mate with the sidewalls 20 of 10 tank, forming a liquid-impermeable seal therebetween in a manner similar to that described above in connection with FIGS. 10-12. In this manner, the corrugations 17 in the liner 11 define the flow channel(s) 18, formed between the exterior surfaces of the sidewalls 24a and 24b of the liner 11 and the interior surfaces of the tank side wall 20. Other than the corrugations 17 being disposed in the liner side wall 24, this embodiment functions in a manner consistent with the embodiments described above that have corrugations 17 disposed in the tank side wall 20.

Figure 54:
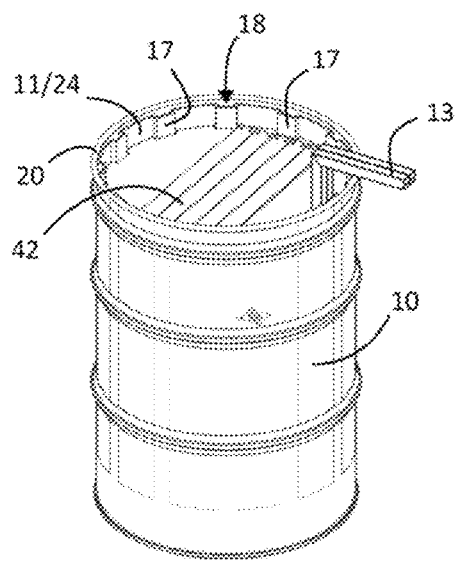
FIG. 54 is a perspective view of an embodiment of a tank having a cylindrical configuration.
Figure 55:
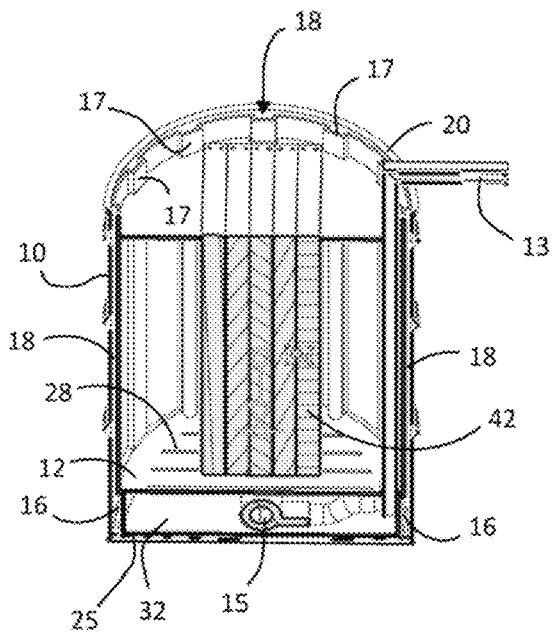
FIG. 55 is a perspective cross section of the embodiment shown in FIG. 54.
Figure 56:
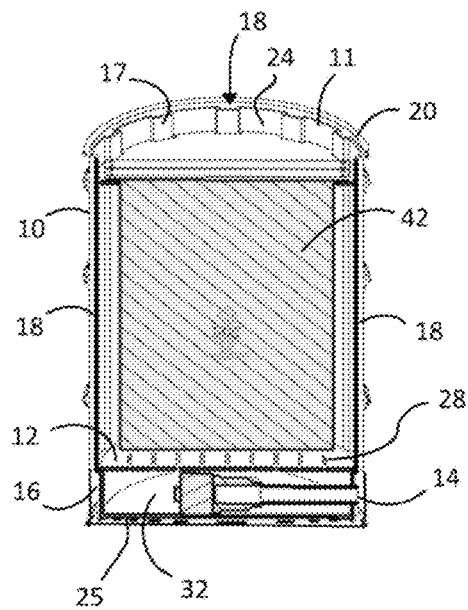
FIG. 56 is a perspective cross section taken approximately orthogonal to the cross section shown in FIG. 55.

In another embodiment, shown in FIGS. 54-56, the tank 10 is cylindrical. As an example, the tank 10 in this embodiment may take the shape of a fifty-five gallon drum, or a similar cylindrical shape or drum shape. In this embodiment, the liner side wall 24 comprises one or more corrugations 17 that, when mated with the tank side wall 20, define the flow channels 18. The principle of operation of this embodiment is the same as that for the embodiments described above. In one mode of operation, the dielectric liquid enters the tank 10 via the inlet 13 and inflow channel 15, and it flows into the chamber 32. As the level of the dielectric liquid rises, it passes through the vents 28 in the support base 12 and continues to rise inside the liner 11 to immerse the electronic object 42. The level of the dielectric liquid then reaches the top of the liner 11, where the dielectric liquid flows into the flow channels 18 defined by the corrugations 17 and the tank side wall 20. The dielectric liquid then exits the tank 10 via the outflow channel 16 and the outlet 14.

Notably, the inlet 13 piping in this embodiment may be disposed inside the liner, as shown in FIGS. 54 and 55. This embodiment promoted ease of manufacturing because it does not require the piping to penetrate the liner side wall 24 or tank side wall 20, thereby requiring a fluid-impermeable seal at the point of entry. In another embodiment, the inlet 13 piping may penetrate the tank side wall 20 and the liner side wall 24 if such a configuration is advantageous to the flow of the dielectric fluid or for locating the container 1 in proximity to other equipment or surroundings.

Figure 57:
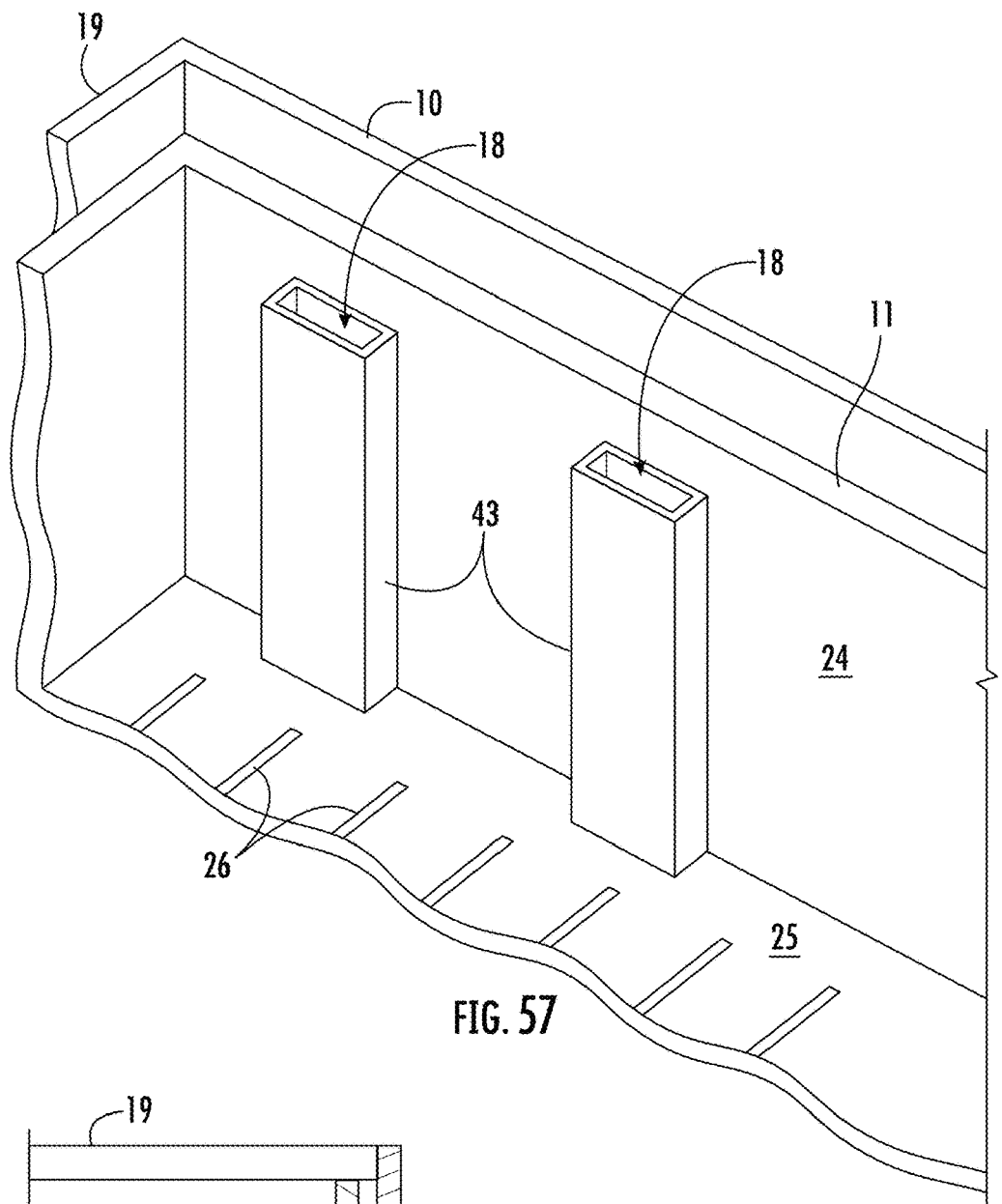
FIG. 57 is a partial perspective view showing an embodiment of the container wherein the flow channels are defined by integrated tubing members.
Figure 58:
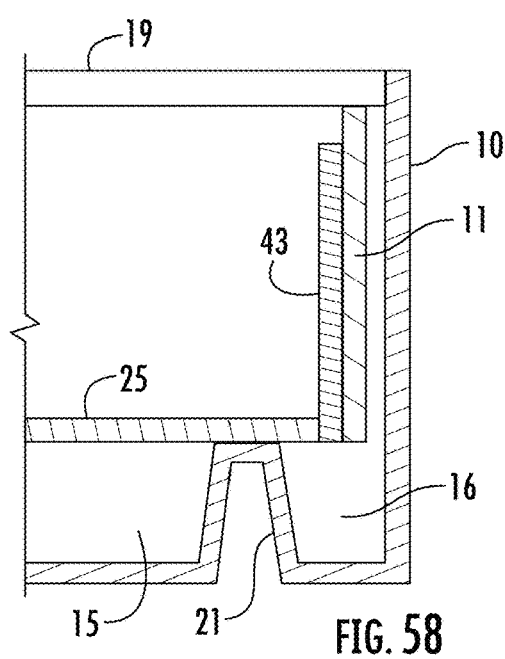
FIG. 58 is a partial cross section of the embodiment shown in FIG. 57.

As another example, the corrugations 17 can be disposed in the liner side wall 24, the tank side wall 20, or a combination of these locations. Alternately, referring to FIGS. 57 and 58, the flow channels 18 may be located inside the liner 11, such as by self-contained channels 43 (such as pipes or tubes having circular or non-circular cross sections) that are attached to the inside or the outside of the liner side wall 24 or to the inside of the tank side wall 20. For example, the flow channel 18 could be metal or plastic tubing 43 having a rectangular cross section and a top and a bottom, where the tubing 43 is attached to the inside of the liner side wall 24, such as by welding or by an adhesive, glue, epoxy, resin, bonding agent, or equivalent means. In such an embodiment, the top of the tubing 43 may be disposed slightly lower than the height H1 such that the dielectric liquid flows into the tubing 43 before overflowing the liner side wall 24. The bottom of the tubing 43 is disposed in fluid communication with the outflow channel, as described above, or by passing through the liner bottom 25 such that the lower open end of the tubing 43 is located in fluid communication with the outflow channel 16.

Figure 59:
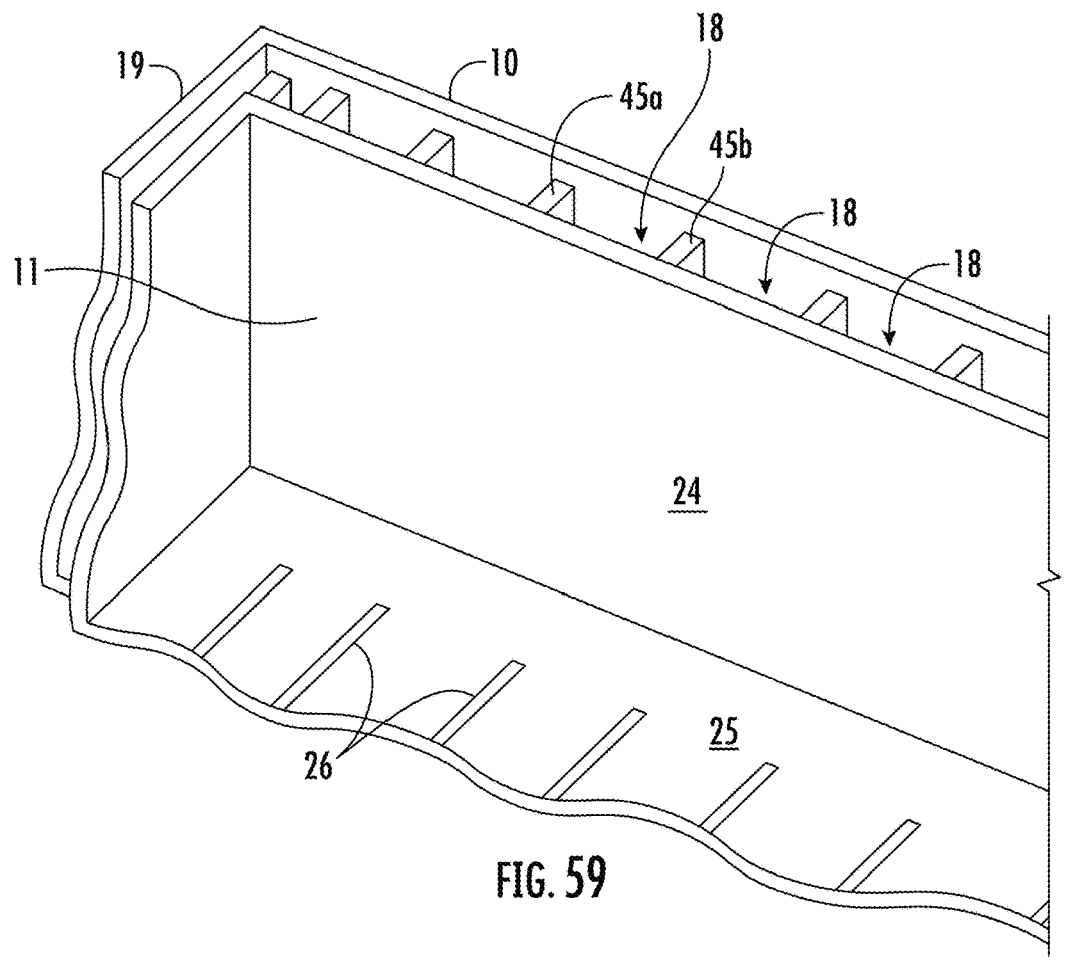
FIG. 59 is a partial perspective view showing an embodiment of the container wherein the flow channels are defined by the liner side wall, the tank side wall, and spacers.
Figure 60:
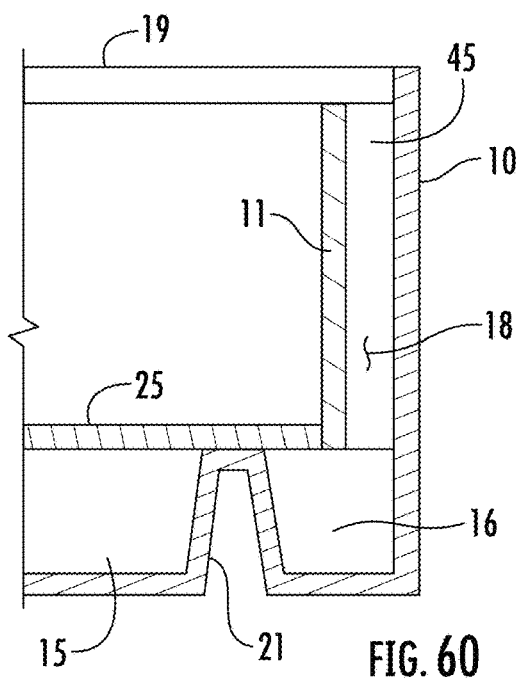
FIG. 60 is a partial cross section of the embodiment shown in FIG. 59.

In another embodiment, shown in FIGS. 59-60, one or more tubing members or other spacers 45 are attached to either the outside of the liner side wall 24, to the inside of the tank side wall 20, or to both. For example, the spacers 45 may be disposed along the H direction in an orientation substantially parallel to the corrugations 17 depicted in the embodiments above. The spacers 45 are located along a length of the outside of the liner side wall 24 such that gaps are defined between the spacers 45, similar to the gaps between the corrugations 17 discussed above. Each gap is located between a first spacer 45*a* and a second spacer 45*b*. The spacers 45 are either incapable of permitting fluid flow, or they are prevented from doing so, such as by capping or plugging the tubing members that act as the spacer 45. When the liner 11 is inserted into the tank 10, the spacers 45 are disposed to separate the liner side wall 24 from the tank side wall 20, just as the corrugations do. The spacers 45 are disposed in a fluid impermeable seal to both the tank side wall 20 and to the liner side wall 24. In this configuration, a flow channel 18 is defined by (i) the inside surface of the tank side wall 20, (ii) the outside surface of the liner side wall 24, (iii) a first spacer 45*a*, and (iv) a second spacer 45*b*. These flow channels 18 are disposed in fluid communication with the outflow channel 16 at the lower part of the tank 10, as described above.

In any of the foregoing embodiments, the container 1 may further comprise a lid, which may be attached to the container 1 via either an unsealed connection or by a liquid-impermeable sealed connection. Attachment of the lid to the container 1 may be desirable to prevent evaporation of the dielectric fluid, or to prevent debris or contamination from entering the container 1.

In any of the foregoing embodiments, the direction of flow of the dielectric liquid may be reversed as desired or as necessary. For example, in reference to the embodiments set forth above, it may be desirable to introduce the dielectric liquid into the container 1 via the outlet 14. The dielectric liquid will then rise up the flow channels 18 and spill into the liner 11, where it flows down through the tray vents 28 and through the liner vents 25 and into the inflow channel 15, and then out the inlet 13. This reversal of flow direction may be desirable for thermal management of certain types of electronic objects 42 or in certain environmental conditions.

In these instances of reversed flow, an optional diffuser, such as a diffuser plate, may be used to disperse the flow of dielectric fluid in a manner more advantageous for thermal management of the electronic object 42. For example, the diffuser may spread the inflowing dielectric liquid more evenly across the top of the dielectric liquid level in the liner 11 so that as the dielectric liquid flows down through the liner 11 its thermal properties are either spread more uniformly throughout the second interior volume. Alternately, the diffuser is configured to direct the dielectric liquid to a certain location or area of the dielectric liquid surface to promote improved thermal management of the specific electronic object 42 disposed inside the liner 11.

The foregoing embodiments are merely representative of the liquid dielectric immersion-cooling container and not meant for limitation of the invention. For example, persons skilled in the art would readily appreciate that there are several embodiments and configurations of tanks, liners, inflow channels, outflow channels, flow channels, and support bases that will not substantially alter the nature of the immersion-cooling container and can be exchanged between the embodiments disclosed herein. In addition, although the above description focuses on cooling the objects positioned within the container, a person of ordinary skill in art will recognize that substantially the same technique can be used to heat or otherwise regulate the temperature of the objects without departing from the principles of the invention. Consequently, it is understood that equivalents and substitutions for certain elements and components set forth above are part of the invention described herein, and the true scope of the invention is set forth in the claims below.

What is claimed is:

1. An immersion-cooling apparatus, comprising:
    a tank having a bottom and one or more walls at least partially enclosing a first interior volume, the tank further having an interior surface;
    a liner disposed within the first interior volume of the tank, the liner having an exterior surface and a second interior volume configured to retain an object therein;
    an inflow channel defined within the first interior volume of the tank and disposed between the tank and the liner;
    an inlet fluidly coupled to the tank and disposed in fluid communication with the inflow channel;
    an outflow channel defined within the first interior volume of the tank, wherein the outflow channel is at least partially disposed between the bottom of the tank and the exterior surface of the liner;
    an outlet fluidly coupled to the tank and disposed in fluid communication with the outflow channel;
    a divider disposed on the interior surface of the tank, the exterior surface of the liner, or both, wherein the divider partitions at least a portion of the first interior volume of the tank into the inflow channel and the outflow channel; and
    a vent aperture disposed within the liner, wherein the vent aperture is in fluid communication with the inflow channel, thereby enabling the dielectric liquid to enter into the second interior volume of the liner via the vent aperture.

2. The immersion-cooling apparatus of claim 1, wherein the inlet or the outlet are fluidly coupled to the bottom of the tank.

3. The immersion-cooling apparatus of claim 1, wherein the inlet or the outlet are fluidly coupled to the one or more walls of the tank.

4. The immersion-cooling apparatus of claim 1, wherein the inflow channel is defined between a bottom of the tank and the exterior surface of the liner.

5. The immersion-cooling apparatus of claim 1, further comprising a down-flow channel defined within a space between the exterior surface of the liner and the interior surface of the one or more walls of the tank, the down-flow channel providing a passage for the dielectric fluid to the outflow channel upon exiting the second interior volume of the liner.

6. The immersion-cooling apparatus of claim 5, wherein a flow regulator is disposed within the down-flow channel, the flow regulator configured to reduce air bubble entrainment within the dielectric liquid.

7. The immersion-cooling apparatus of claim 5, wherein the inlet or the outlet are fluidly coupled to the bottom of the tank.

8. The immersion-cooling apparatus of claim 5, wherein the inlet or the outlet are fluidly coupled to the one or more walls of the tank.

9. The immersion-cooling apparatus of claim 5, wherein the inflow channel is defined between a bottom of the tank and the exterior surface of the liner.

10. The immersion-cooling apparatus of claim 5, further comprising a ledge disposed on the interior surface of the one or more walls of the tank, wherein the ledge, the interior surface of the one or more walls of the tank, and the exterior surface of the liner collectively define the down-flow channel.

11. The immersion-cooling apparatus of claim 10, wherein the ledge has a downward slope directing the dielectric liquid to flow toward the outlet.

12. The immersion-cooling apparatus of claim 5, wherein the exterior surface of the liner is at least partially disposed in an abutting contact with the one or more walls of the tank, forming a liquid-impermeable seal at an interface thereof.

13. The immersion-cooling apparatus of claim 5, wherein the liner has one or more corrugations defining the down-flow channel.

14. The immersion-cooling apparatus of claim 5, wherein the tank has one or more corrugations defining the down-flow channel.

15. The immersion-cooling apparatus of claim 5, wherein the dielectric fluid enters the down-flow channel upon overflowing the liner.

16. The immersion-cooling apparatus of claim 1, wherein the exterior surface of the liner is at least partially disposed in an abutting contact with the one or more walls of the tank, forming a liquid-impermeable seal at an interface thereof.

17. The immersion-cooling apparatus of claim 1, wherein the divider comprises a ridge.

18. The immersion-cooling apparatus of claim 1, further comprising a support base configured to be disposed inside the liner, wherein the support base has a plurality of apertures configured to permit the dielectric fluid to flow therethrough.

19. The immersion-cooling apparatus of claim 1, wherein the liner has a first sidewall and a second sidewall, and wherein the first sidewall is lower than the second sidewall.

* * * * *